United States Patent
Nakatsuka

(10) Patent No.: US 10,748,920 B2
(45) Date of Patent: Aug. 18, 2020

(54) SEMICONDUCTOR MEMORY DEVICE

(71) Applicant: TOSHIBA MEMORY CORPORATION, Tokyo (JP)

(72) Inventor: Keisuke Nakatsuka, Kobe Hyogo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/126,209

(22) Filed: Sep. 10, 2018

(65) Prior Publication Data

US 2019/0259775 A1     Aug. 22, 2019

(30) Foreign Application Priority Data

Feb. 19, 2018   (JP) .................. 2018-027165

(51) Int. Cl.
| | | |
|---|---|---|
| H01L 29/76 | (2006.01) | |
| H01L 27/11582 | (2017.01) | |
| H01L 29/40 | (2006.01) | |
| H01L 27/11565 | (2017.01) | |
| H01L 21/28 | (2006.01) | |
| H01L 29/792 | (2006.01) | |

(52) U.S. Cl.
CPC .. *H01L 27/11582* (2013.01); *H01L 27/11565* (2013.01); *H01L 29/408* (2013.01); *H01L 29/40117* (2019.08); *H01L 29/7926* (2013.01)

(58) Field of Classification Search
CPC ......... H01L 27/11582; H01L 27/11556; H01L 27/11524; H01L 27/11565; H01L 29/40117; H01L 29/40114; H01L 29/78; H01L 29/4234; H01L 27/1052; H01L 29/495; H01L 29/511; H01L 29/51; H01L 29/401

USPC ........................................................ 257/314
See application file for complete search history.

(56) References Cited

U.S. PATENT DOCUMENTS

| | | | |
|---|---|---|---|
| 6,977,205 B2 | 12/2005 | Komatsubara | |
| 8,664,631 B2 | 3/2014 | Hirota et al. | |
| 9,530,899 B2 | 12/2016 | Kim et al. | |
| 9,837,435 B1 | 12/2017 | Chang et al. | |

(Continued)

FOREIGN PATENT DOCUMENTS

| | | |
|---|---|---|
| JP | 2007-266143 A | 10/2007 |
| JP | 4540320 B2 | 7/2010 |

(Continued)

*Primary Examiner* — Theresa T Doan
(74) *Attorney, Agent, or Firm* — Foley & Lardner LLP

(57) ABSTRACT

According to one embodiment, a semiconductor memory device includes a plurality of electrode films, a semiconductor member, a tunneling insulating film, a charge storage member, and a blocking insulating film. The plurality of electrode films are arranged to be separated from each other along a first direction. The semiconductor member extends in the first direction. The tunneling insulating film is provided between the semiconductor member and the electrode films. The charge storage member is provided between the tunneling insulating film and the electrode films. The blocking insulating film is provided between the charge storage member and the electrode films. The blocking insulating film includes a first film contacting the charge storage film and including carbon-containing silicon oxide, and a second film contacting the electrode films and including hafnium oxide or aluminum oxide.

10 Claims, 22 Drawing Sheets

(56) References Cited

U.S. PATENT DOCUMENTS

2007/0252201 A1 11/2007 Kito et al.
2014/0159137 A1 6/2014 Yun et al.
2017/0069654 A1* 3/2017 Matsuo ............. H01L 27/11582
2017/0263614 A1 9/2017 Tokuhira et al.

FOREIGN PATENT DOCUMENTS

| JP | 2012-195357 | A | 10/2012 |
| TW | 201431046 | A | 8/2014 |
| TW | I605575 | B | 11/2017 |
| TW | 201803089 | A | 1/2018 |

\* cited by examiner

SEMICONDUCTOR MEMORY DEVICE

CROSS-REFERENCE TO RELATED APPLICATION

This application is based upon and claims the benefit of priority from Japanese Patent Application NO. 2018-027165, filed on Feb. 19, 2018; the entire contents of which are incorporated herein by reference.

FIELD

Embodiments described herein relate generally to a semiconductor memory device.

BACKGROUND

Conventionally, higher capacity of a two-dimensional semiconductor memory device has been realized, by downscaling the circuit. However, because downscaling technology is, approaching a limit, a three-dimensional semiconductor memory device is being developed to realize even higher capacity. In the three-dimensional semiconductor memory device, a stacked body in which multiple electrode films are stacked is provided on a substrate; multiple semiconductor members that pierce the stacked body are provided; and memory cell transistors are formed at the crossing portions between the electrode films and the semiconductor member.

In the two-dimensional semiconductor memory device, the neutral threshold of the memory cell transistor is controlled by performing ion implantation into a semiconductor substrate used to form a channel. However, in the three-dimensional semiconductor memory device, it is difficult to introduce an impurity with high precision and at a low concentration into the semiconductor member used to form the channel. Therefore, it is difficult to control the neutral threshold of the memory cell transistor in the three-dimensional semiconductor memory device.

DETAILED DESCRIPTION

According to one embodiment, a semiconductor memory device includes a plurality of electrode films, a semiconductor member, a tunneling insulating film, a charge storage member, and a blocking insulating film. The plurality of electrode films are arranged to be separated from each other along a first direction. The semiconductor member extends in the first direction. The tunneling insulating film is provided between the semiconductor member and the electrode films. The charge storage member is provided between the tunneling insulating film and the electrode films. The blocking insulating film is provided between the charge storage member and the electrode films. The blocking insulting film includes a first film contacting the charge storage film and including carbon-containing silicon oxide, and a second film contacting the electrode films and including hafnium oxide or aluminum oxide.

First Embodiment

A first embodiment will now be described.

Figure 1:
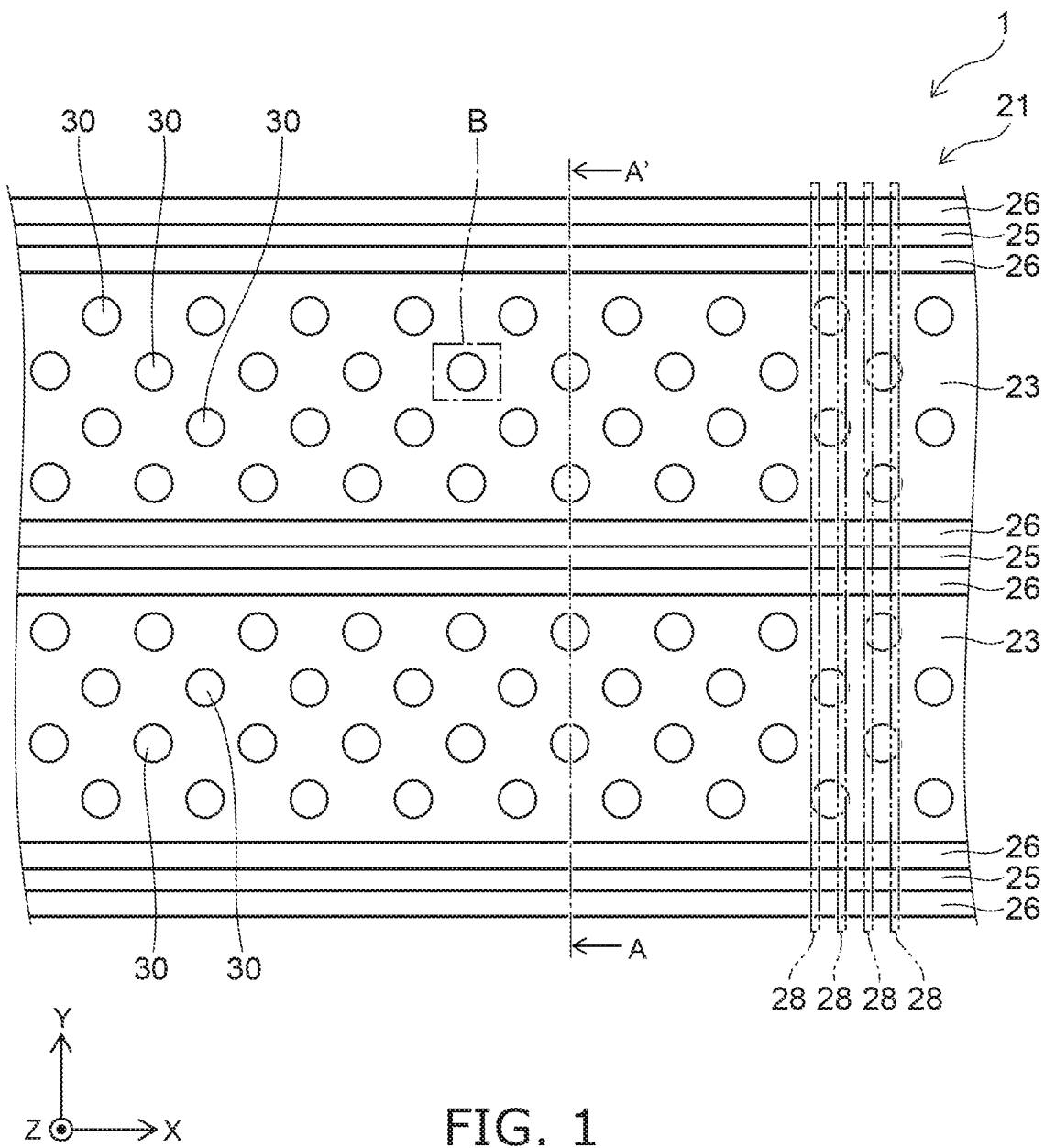
FIG. 1 is a plan view showing a semiconductor memory device according to a first embodiment.

FIG. 1 is a plan view showing a semiconductor memory device according to the embodiment.

Figure 2:
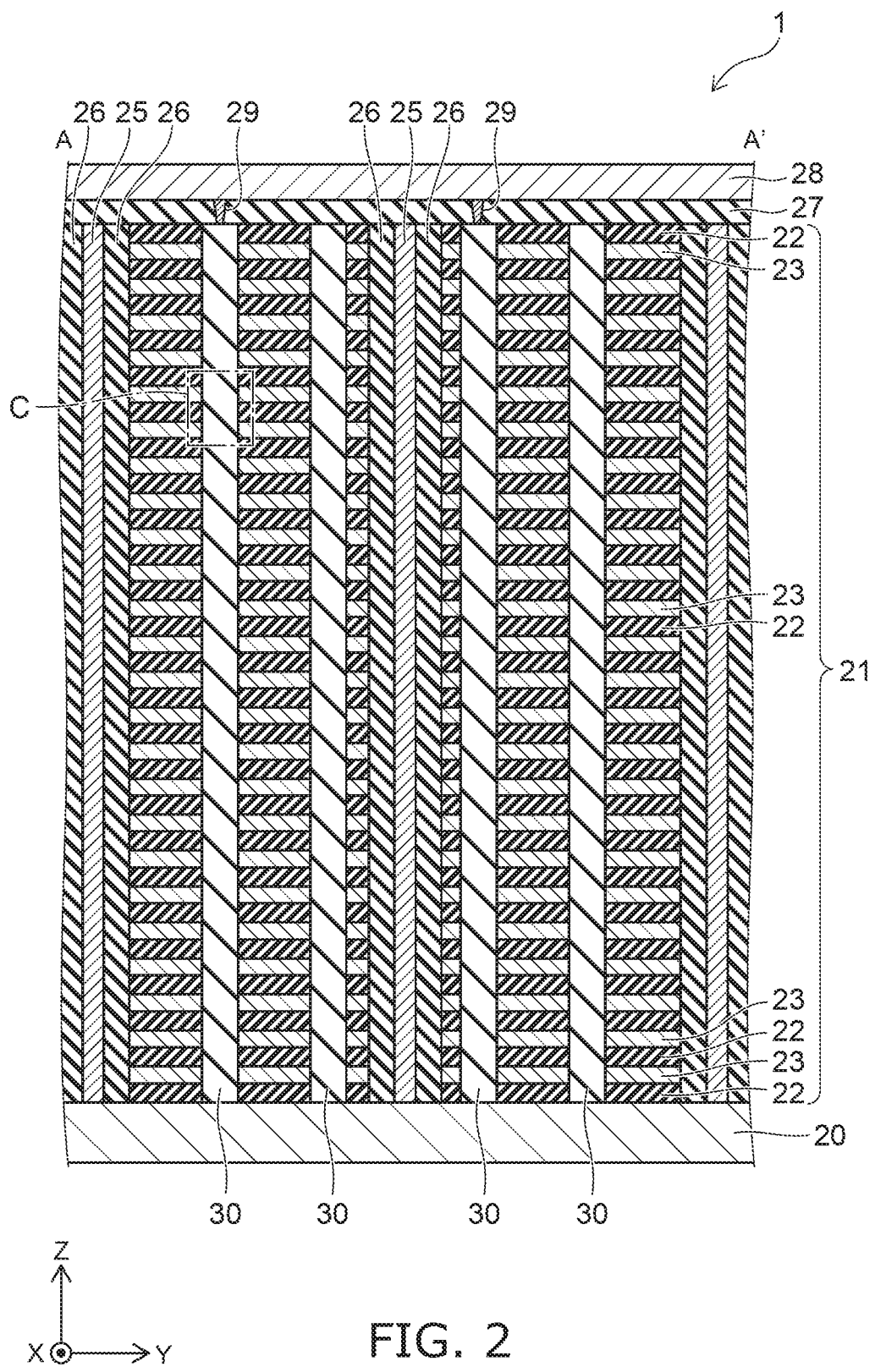
FIG. 2 is a cross-sectional view along line A-A' shown in FIG. 1.

FIG. 2 is a cross-sectional view along line A-A' shown in FIG. 1.

Figure 3:
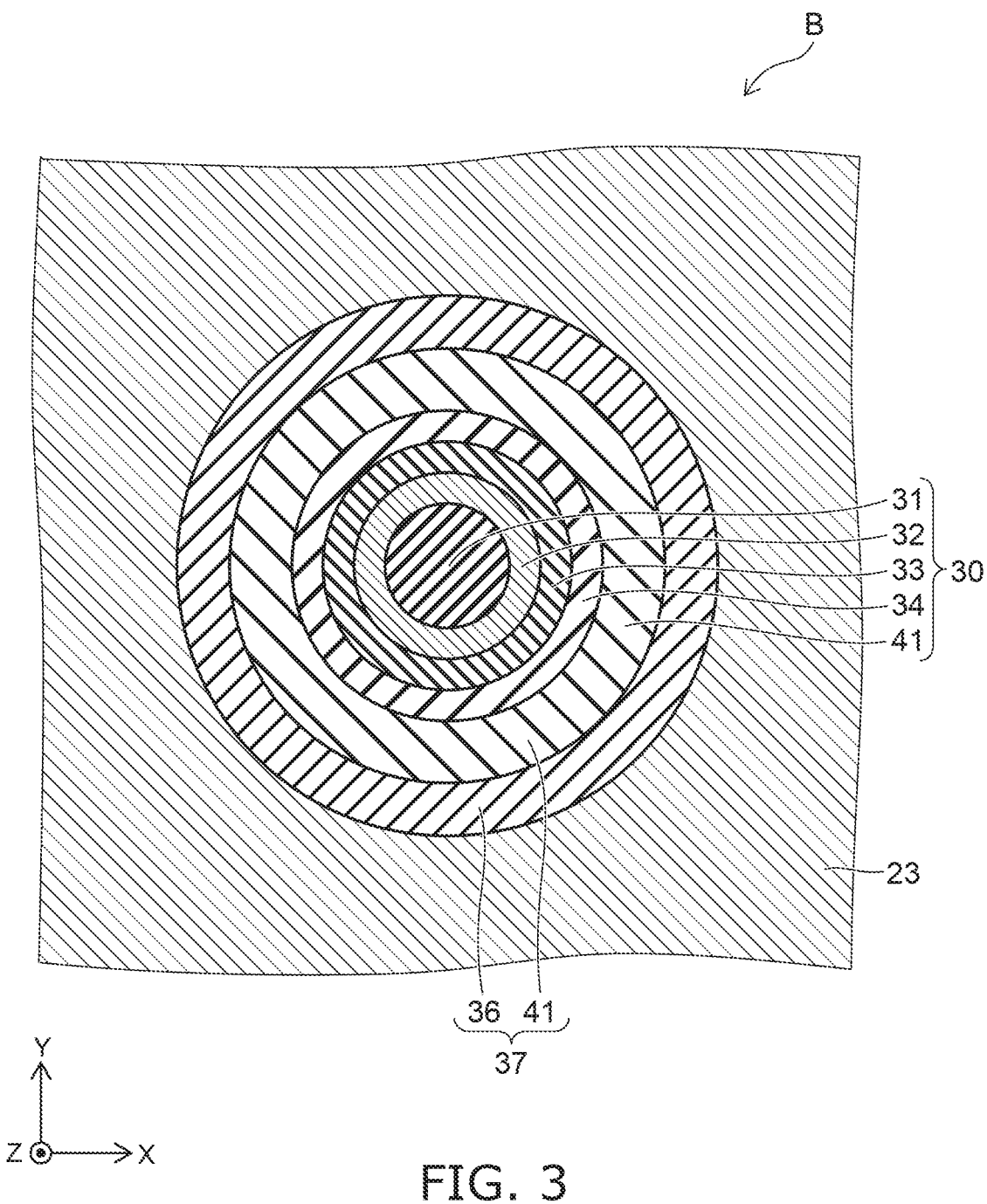
FIG. 3 is a cross-sectional view corresponding to region B of FIG. 1.

FIG. 3 is a cross-sectional view corresponding to region B of FIG. 1.

Figure 4:
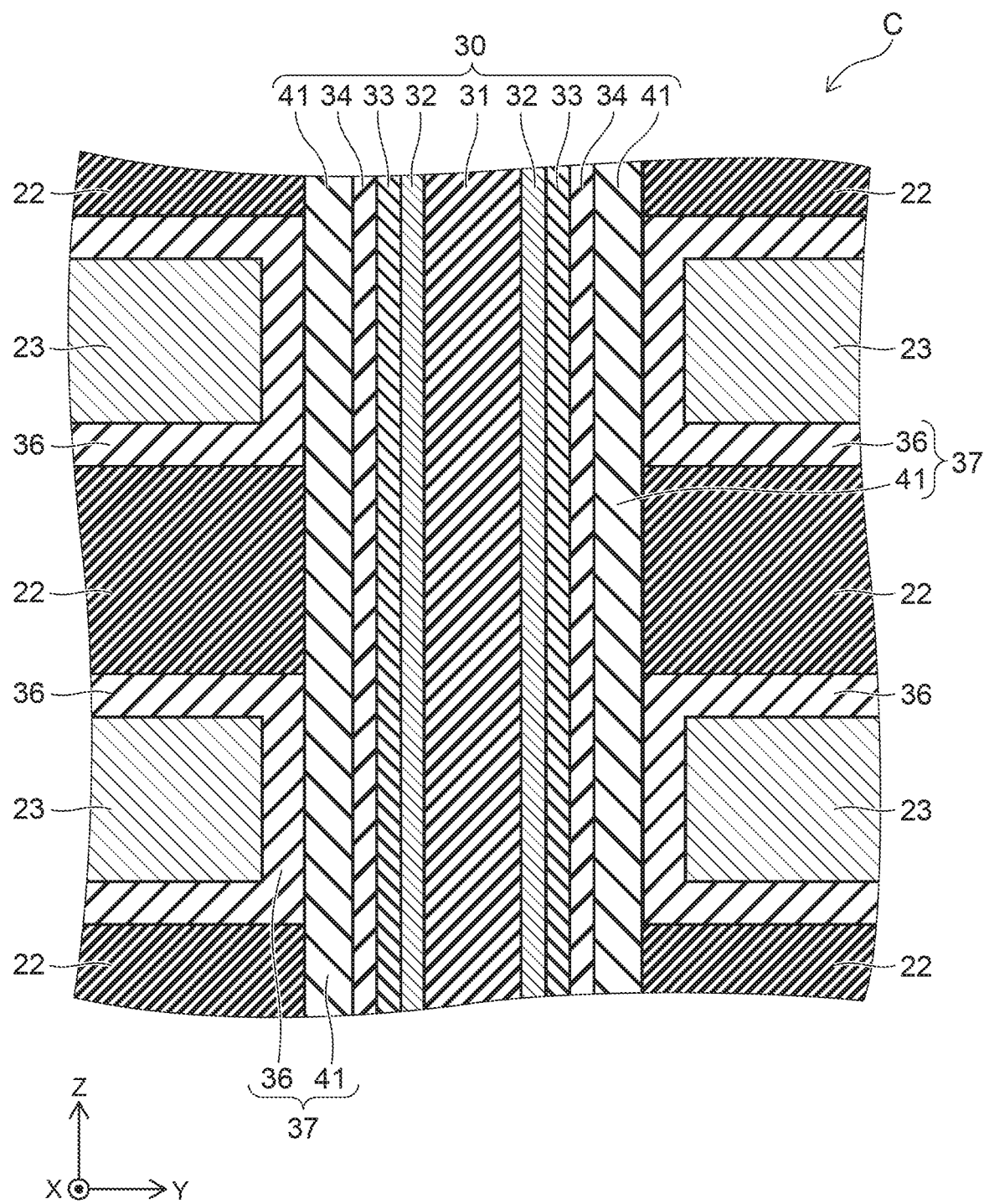
FIG. 4 is a cross-sectional view corresponding to region C of FIG. 2.

FIG. 4 is across-sectional view corresponding to region C of FIG. 2.

The drawings are schematic and are drawn with appropriate exaggerations or omissions. For example, the components are drawn to be larger and fewer than the actual components. The numbers, dimensional ratios, etc., of the components do not always match between the drawings. This is similar for the drawings described below as well.

The semiconductor memory device according to the embodiment is three-dimensional NAND flash memory.

As shown in FIG. 1 and FIG. 2, a silicon substrate 20 is provided in the semiconductor memory device 1 according to the embodiment (hereinbelow, also called simply the "device 1"). For example, the silicon substrate 20 is formed of a single crystal of silicon (Si). A stacked body 21 is provided on the silicon substrate 20.

In the specification hereinbelow, an XYZ orthogonal coordinate system is employed for convenience of description. The arrangement direction of the silicon substrate 20 and the stacked body 21 is taken as a "Z-direction." Although a direction that is in the Z-direction from the silicon substrate 20 toward the stacked body 21 also is called "up" and the reverse direction also is called "down," these expressions are for convenience and are independent of the direction of gravity. Two mutually-orthogonal directions orthogonal to the Z-direction are taken as an "X-direction" and a "Y-direction."

Insulating films 22 and electrode films 23 are stacked alternately along the Z-direction in the stacked body 21. The insulating films 22 are made from an insulating material and are made of, for example, silicon oxide (SiO). The electrode films 23 are made from a conductive material and include, for example, tungsten (W). For example, a barrier metal layer (not illustrated) in which a titanium layer and a titanium nitride layer are stacked may be provided at a portion of the surfaces of the electrode films 23. The configurations of the two X-direction end portions of the stacked body 21 (not illustrated) are staircase configurations in which a terrace is formed every electrode film 23.

A conductive plate 25 that has a plate configuration spreading along the XZ plane is provided inside the stacked body 21. The conductive plate 25 pierces the stacked body 21 in the X-direction and the Z-direction; and the lower end of the conductive plate 25 is connected to the silicon substrate 20. The conductive plate 25 is formed of a conductive material and is formed of, for example, tungsten and/or silicon. For example, the conductive plates 25 are arranged at uniform spacing along the Y-direction.

Insulating plates 26 are provided on the two Y-direction sides of each of the conductive plates 25. For example, the insulating plates 26 are formed of an insulating material such as silicon oxide, etc. The conductive plate 25 is insulated from the electrode films 23 by the insulating plates 26. Each of the electrode films 23 is divided into multiple portions in the Y-direction by a structure body made of one conductive plate 25 and two insulating plates 26 on the two sides of the one conductive plate 25. Each portion of the divided electrode film 23 is an interconnect extending in the X-direction. A member "extending in the X-direction" means that the length in the X-direction of the member is longer than the length in the Y-direction and the length in the Z-direction. This is similar also for cases extending in the Y-direction and extending in the Z-direction. The stacked body that is made of the insulating films 22 and the electrode films 23 is disposed in each region between the structure bodies made of the one conductive plate 25 and the two insulating plates 26 on the two sides of the one conductive plate 25. In other words, the multiple electrode films 23 that are arranged to be separated from each other along the Z-direction are provided in one stacked body. Also, when viewed from the one stacked body, an adjacent stacked body is disposed on the Y-direction side.

A columnar member 30 that extends in the Z-direction is multiply provided in the portion of the stacked body 21 interposed between the conductive plates 25. The columnar member 30 pierces the stacked body 21 in the Z-direction. The configuration of the columnar member 30 is a substantially columnar configuration having a central axis extending in the Z-direction and is, for example, a substantially circular columnar configuration, a substantially elliptical columnar configuration, or a substantially quadrilateral prism configuration. In the drawings and the description hereinbelow, the case is illustrated where the configuration of the columnar member 30 is a circular columnar configuration. When viewed from the Z-direction, for example, the columnar members 30 are arranged in a staggered configuration.

An insulating film 27 is provided on the stacked body 21; and bit lines 28 that extend in the Y-direction are provided on the insulating film 27. Plugs 29 are provided inside the insulating film 27. The insulating film 27 also covers the end portions (not illustrated) having the staircase configurations of the stacked body 21 and is disposed also at the sides of the stacked body 21, that is, on the X-direction side and the Y-direction side.

As shown in FIG. 3 and FIG. 4, a core member 31 is provided in the columnar member 30. The core member 31 is formed of an insulating material and is formed of, for example, silicon oxide. The configuration of the core member 31 is a substantially circular column having a central axis extending in the Z-direction. A silicon pillar 32 is provided at the periphery of the core member 31. The silicon pillar 32 is formed of silicon which is a semiconductor material. The configuration of the silicon pillar 32 is a substantially circular tube having a central axis extending in the Z-direction. The lower end of the silicon pillar 32 is connected to the silicon substrate 20; and the upper end of the silicon pillar 32 is connected to the bit line 28 (referring to FIG. 2) via the plug 29 (referring to FIG. 2).

A tunneling insulating film 33, a charge storage film 34, and a fixed charge retaining film 41 are stacked in this order from the silicon pillar 32 side toward the outer side of the columnar member 30 at the periphery of the silicon pillar 32. The fixed charge retaining film 41 contacts the charge storage film 34. The configurations of the tunneling insulating film 33, the charge storage film 34, and the fixed charge retaining film 41 are substantially circular tubes having central axes extending in the Z-direction.

Although the tunneling insulating film 33 normally is insulative, the tunneling insulating film 33 is a film in which a tunneling current flows when a prescribed voltage within the range of the drive voltage of the device 1 is applied and is, for example, an ONO film in which a silicon oxide layer, a silicon nitride layer, and a silicon oxide layer are stacked in this order. The charge storage film 34 is a film that can store charge, is formed of, for example, an insulating material having trap sites of electrons, and is made of, for example, silicon nitride (SiN).

The fixed charge retaining film 41 includes a fixed charge retaining material. In the specification, "fixed charge retaining material" refers to a material in which a positive or negative charge can be retained stably. There are multiple types of fixed charge retaining materials; and the polarity of the charge that can be retained is different between process factors such as the film formation conditions, etc., even for the same composition. Examples of fixed charge retaining materials are shown in Table 1 recited below.

TABLE 1

| Polarity of fixed charge | Material | Composition example | Film formation condition |
|---|---|---|---|
| Positive | Carbon-containing silicon oxide | SiO$_2$ + C | Heat treatment at or below 500° C. |
| Positive | Silicon nitride | Si$_3$N$_4$ | Nitrided silicon |
| Positive | Hafnium oxide | HfO$_2$ | |
| Negative | Silicon oxynitride | SiON | Nitrided silicon oxide |
| Negative | Silicon nitride | Si$_3$N$_4$ | Deposition |
| Negative | Aluminum oxide | Al$_2$O$_3$ | |
| Negative | Hafnium oxide | HfO$_2$ | |
| Negative | Carbon-containing silicon oxide | SiO$_2$ + C | Heat treatment at or above 700° C. |

As shown in Table 1, for example, carbon-containing silicon oxide having heat treatment at a temperature of 500° C. or less, silicon nitride formed by nitriding silicon, and hafnium oxide are materials that can retain a positive fixed charge. On the other hand, for example, silicon oxynitride formed by nitriding silicon oxide, silicon nitride formed by deposition, aluminum oxide, hafnium oxide, and carbon-containing silicon oxide having heat treatment at a temperature of 700° C. or more are materials that can retain a negative fixed charge. Although hafnium oxide can retain either a positive or negative fixed charge, the polarity of the retained fixed charge is dependent on multiple factors. It is sufficient for the fixed charge retaining film 41 to include one or more types of materials of the fixed charge retaining materials shown in Table 1. For example, the entire fixed charge retaining film 41 may be formed of a fixed charge retaining material shown in Table or a fixed charge retaining material shown in Table 1 may be diffused or dispersed in a main material made of silicon oxide, etc. This is similar for the fixed charge retaining films and the fixed charge retaining members of the other embodiments described below as well.

As described above, the fixed charge retaining film 41 includes at least one type of material selected from the group consisting of carbon-containing silicon oxide, silicon nitride, hafnium oxide, silicon oxynitride, and aluminum oxide. In the embodiment, for example, the fixed charge retaining film 41 is formed of carbon-containing silicon oxide and retains a negative fixed charge.

A high dielectric constant film 36 is provided at the periphery of the columnar member 30. The high dielectric constant film 36 is formed of a high dielectric constant material having a higher dielectric constant than silicon oxide and is formed of, for example, aluminum oxide or hafnium oxide. The high dielectric constant film 36 is provided on the upper surface of the electrode film 23, on the lower surface of the electrode film 23, and on the side surface of the electrode film 23 facing the columnar member 30 and is not provided on the side surface of the electrode film 23 facing the insulating plate 26. The high dielectric constant film 36 contacts the fixed charge retaining film 41, the electrode films 23, and the insulating films 22. A blocking insulating film 37 is formed of the fixed charge retaining film 41 and the high dielectric constant film 36. The blocking insulating film 37 is a film in which a current substantially does not flow even when a voltage within the range of the drive voltage of the device 1 is applied.

In the stacked body 21, one or multiple electrode films 23 from the top function as an upper select gate line; and an upper select gate transistor is configured at each crossing portion between the upper select gate line and the silicon pillars 32. Also, one or multiple electrode films 23 from the bottom function as a lower select gate line; and a lower select gate transistor is configured at each crossing portion between the lower select gate line and the silicon pillars 32. The electrode films 23 other than the upper select gate line and the lower select gate line function as word lines; and a memory cell transistor is configured at each crossing portion between the word lines and the silicon pillars 32. The silicon pillar 32 functions as channels of the memory cell transistors; and the electrode films 23 function as, gates of the memory cell transistors. Thereby, a NAND string is formed by the multiple memory cell transistors being connected in series along each of the silicon pillars 32 and by the upper select gate transistor and the lower select gate transistor being connected at the two ends of the multiple memory cell transistors.

Effects of the embodiment will now be described.

In the semiconductor memory device 1 according to the embodiment, the fixed charge retaining film 41 is provided between the silicon pillar 32 and the electrode film 23. Thereby, the neutral threshold of the memory cell transistor can be adjusted.

For example, in the case where a negative fixed charge is retained by the fixed charge retaining film 41, the memory cell transistor is not set to the ON state unless a positive potential high enough to cancel the fixed charge is applied to the electrode film 23. Therefore, compared to the case where there is no negative fixed charge, the neutral threshold of the memory cell transistor is high with respect to the electrode film 23. On the other hand, in the case where a positive fixed charge is retained by the fixed charge retaining film 41, the electric field that is generated by the fixed charge is superimposed onto the electric field generated by the positive potential of the electrode film 23. Therefore, compared to the case where there is no positive fixed charge, the neutral threshold of the memory cell transistor is low when viewed from the electrode film 23.

Thus, by adjusting the neutral threshold of the memory cell transistor, discrepancies can be avoided such as the control of the read potential applied to the electrode film 23 (the word line) being difficult due to the neutral threshold being too low, or misprogramming occurring in the read operation because the read potential must be high due to the neutral threshold being too high.

Second Embodiment

A second embodiment will now be described.

Figure 5:
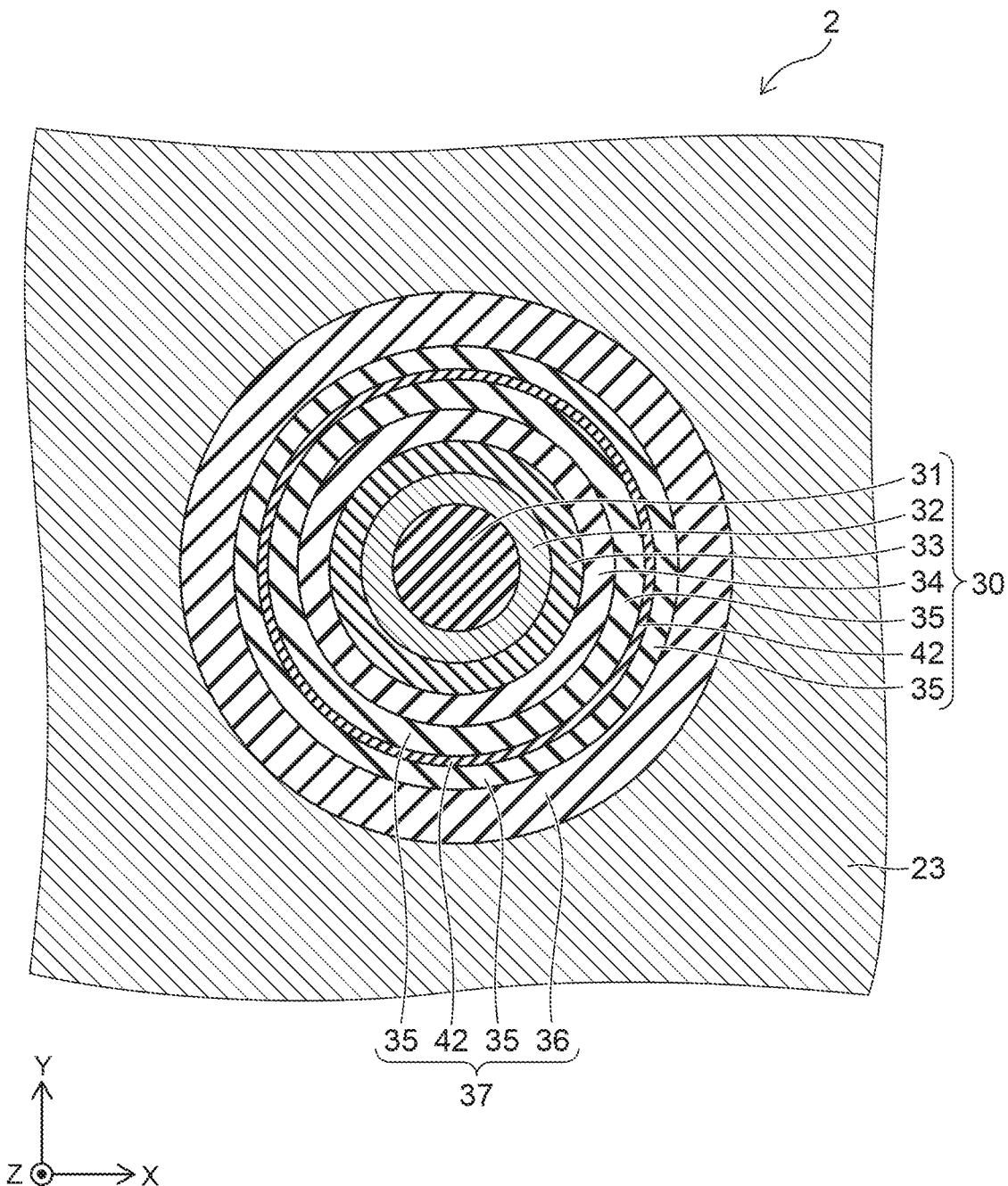
FIG. 5 is a cross-sectional view showing the columnar member of a semiconductor memory device according to a second embodiment.

FIG. 5 is a cross-sectional view showing the columnar member of a semiconductor memory device according to the embodiment.

FIG. 5 shows a cross section corresponding to FIG. 3.

As shown in FIG. 5, the semiconductor memory device 2 according to the embodiment differs from the semiconductor memory device 1 according to the first embodiment described above (referring to FIG. 1 to FIG. 4) in that a silicon oxide film 35 and a fixed charge retaining film 42 are provided instead of the fixed charge retaining film 41. In other words, the blocking insulating film 37 includes the silicon oxide film 35, the fixed charge retaining film 42, and the high dielectric constant film 36. The columnar member 30 includes the core member 31, the silicon pillar 32, the tunneling insulating film 33, the charge storage film 34, the silicon oxide film 35, and the fixed charge retaining film 42.

The silicon oxide film 35 is formed of silicon oxide and contacts the charge storage film 34 and the high dielectric constant film 36. The fixed charge retaining film 42 is disposed inside the silicon oxide film 35. The configuration of the fixed charge retaining film 42 is a substantially circular tube having a central axis extending in the Z-direction. The material of the fixed charge retaining film 42 may be selected from the materials shown in Table 1. For example, the fixed charge retaining film 42 is formed of silicon nitride or aluminum oxide and retains a negative fixed charge.

Otherwise, the configuration of the semiconductor memory device 2 is similar to that of the first embodiment described above. In other words, the overall configuration of the semiconductor memory device 2 is as shown in FIG. 1 and FIG. 2.

In the embodiment as well, similarly to the first embodiment described above, the neutral threshold of the memory cell transistor can be adjusted by providing the fixed charge retaining film 42. In the embodiment, the formation of a leakage path between the charge storage film 34 and the electrode film 23 by the fixed charge retaining film 42 can be suppressed because the fixed charge retaining film 42 is disposed inside the silicon oxide film 35 and does not contact the charge storage film 34 and the high dielectric constant film 35. The fixed charge retaining film 42 may be disposed on the surface of the silicon oxide film 35. Even in such a case, the leakage path between the charge storage film 34 and the electrode film 23 formed by the fixed charge retaining film 42 is blocked by the silicon oxide film 35; and the leakage current can be suppressed. Otherwise, the effects of the embodiment are similar to those of the first embodiment described above.

Third Embodiment

A third embodiment will now be described.

Figure 6:
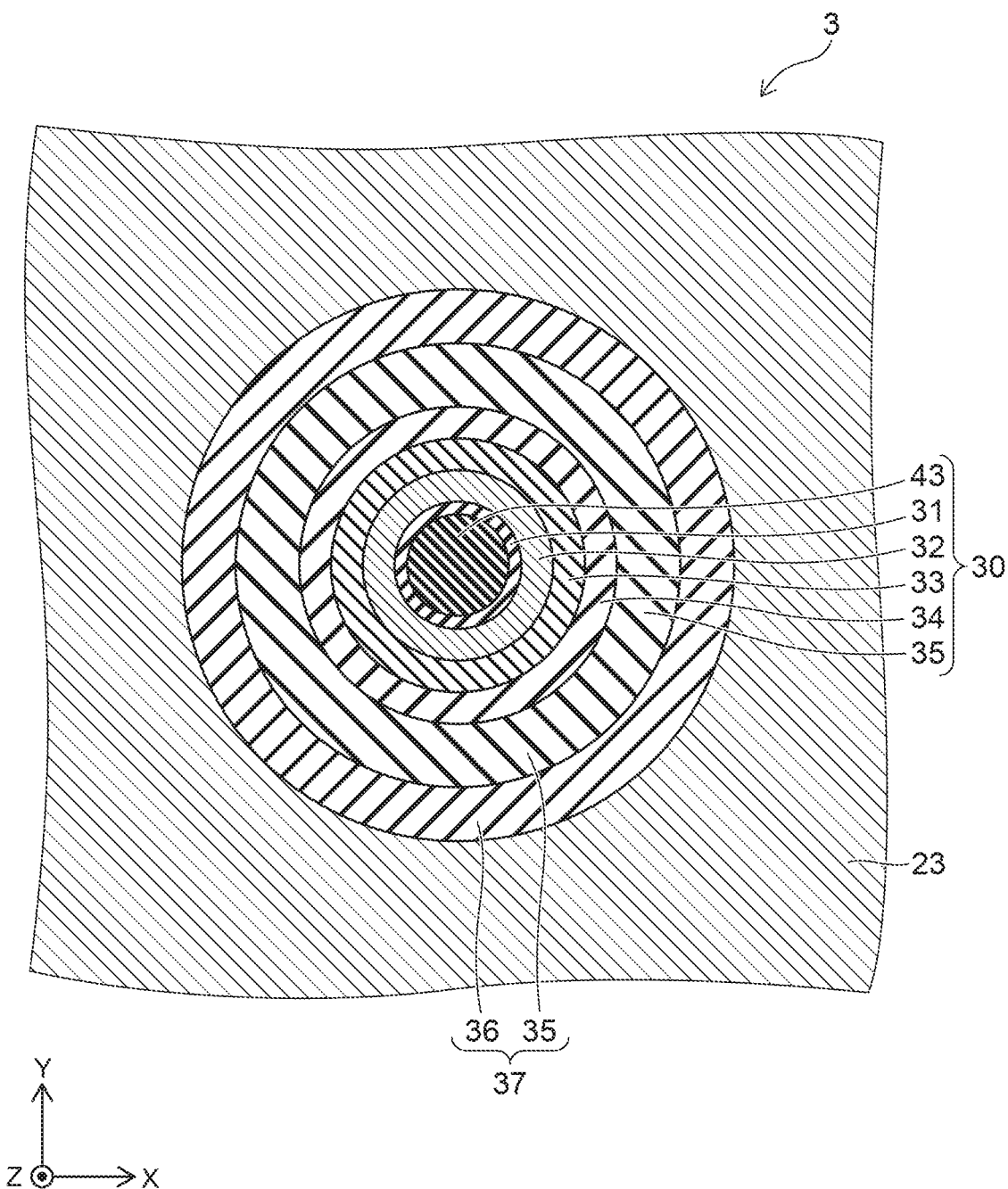
FIG. 6 is a cross-sectional view showing the columnar member of a semiconductor memory device according to a third embodiment.

FIG. 6 is a cross-sectional view showing the columnar member of a semiconductor memory device according to the embodiment.

FIG. 6 shows a cross section corresponding to FIG. 3.

As shown in FIG. 6, the semiconductor memory device 3 according to the embodiment differs from the semiconductor memory device 1 according to the first embodiment described above (referring to FIG. 1 to FIG. 4) in that a fixed charge retaining member 43 is provided inside the core member 31; and the silicon oxide film 35 is provided instead of the fixed charge retaining film 41. In other words, the columnar member 30 includes the fixed charge retaining member 43, the core member 31, the silicon pillar 32, the tunneling insulating film 33, the charge storage film 34, and the silicon oxide film 35. The blocking insulating film 37 includes the silicon oxide film 35 and the high dielectric constant film 36. The configuration of the fixed charge retaining member 43 is, for example, a substantially circular column having a central axis extending in the Z-direction. In the embodiment, the configuration of the core member 31 is a substantially circular tube having a central axis extending in the Z-direction.

The fixed charge retaining member 43 includes a fixed charge retaining material shown in Table 1. Specifically, the fixed charge retaining member 43 may be formed of a material shown in Table 1; or a material shown in Table 1 may be included inside a main material made of silicon oxide. For example, the fixed charge retaining member 43 may be formed by depositing a material shown in Table 1. Or, the fixed charge retaining member 43 can be formed by forming carbon-containing silicon oxide by diffusing carbon in a main material made of silicon oxide, forming silicon oxynitride or silicon nitride by diffusing nitrogen in a main material made of silicon oxide, forming aluminum oxide in a main material made of silicon oxide by diffusing aluminum in the main material, or forming hafnium oxide in a main material made of silicon oxide by diffusing hafnium in the main material.

In the embodiment, when viewed from the electrode film 23, the threshold of the memory cell transistor can be adjusted by providing the fixed charge retaining member 43 behind the silicon pillar 32 used to form the channel and by the fixed charge retaining member 43 retaining a fixed charge. For example, by the fixed charge retaining member 43 retaining a negative fixed charge, the neutral threshold of the memory cell transistor can be set to be high compared to the case where there is no fixed charge. By the fixed charge retaining member 43 retaining a positive fixed charge, the neutral threshold of the memory cell transistor can be set to be low compared to the case where there is no fixed charge.

Also, the flow of an OFF leakage current inside the fixed charge retaining member 43 can be suppressed because the fixed charge retaining member 43 is separated from the silicon pillar 32 by the core member 31.

Otherwise, the configuration and the effects of the embodiment are similar to those of the first embodiment described above.

Fourth Embodiment

A fourth embodiment will now be described.

Figure 7:
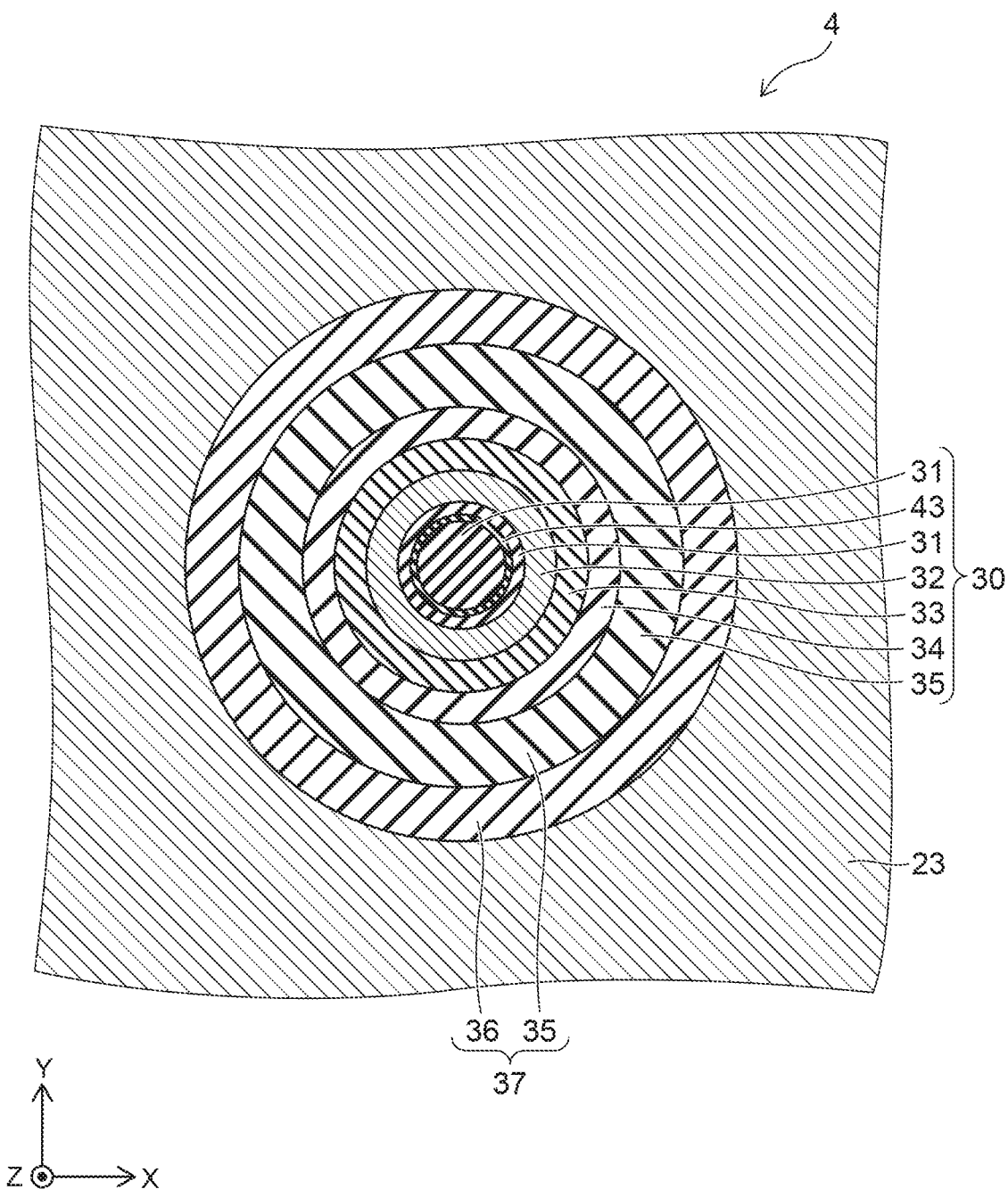
FIG. 7 is a cross-sectional view showing the columnar member of a semiconductor memory device according to a fourth embodiment.

FIG. 7 is a cross-sectional view showing the columnar member of a semiconductor memory device according to the embodiment.

FIG. 7 shows a cross section corresponding to FIG. 3.

As shown in FIG. 7, the semiconductor memory device 4 according to the embodiment differs from the semiconductor memory device 3 according to the third embodiment described above (referring to FIG. 6) in that the configuration of the fixed charge retaining member 43 is a substantially circular tube. In the embodiment, the configuration of the core member 31 is a substantially circular column. In other words, the core member 31 is disposed on both the inner side and the outer side of the fixed charge retaining member 43.

According to the embodiment, because the configuration of the fixed charge retaining member 43 is a substantially circular tube, the distance between the fixed charge retaining member 43 and the silicon pillar 32 can be controlled with high precision. As a result, the neutral threshold of the memory cell transistor can be adjusted by controlling the distance between the fixed charge retaining member 43 and the silicon pillar 32.

Otherwise, the configuration and the effects of the embodiment are similar to those of the third embodiment described above.

Fifth Embodiment

A fifth embodiment will now be described.

Figure 8:
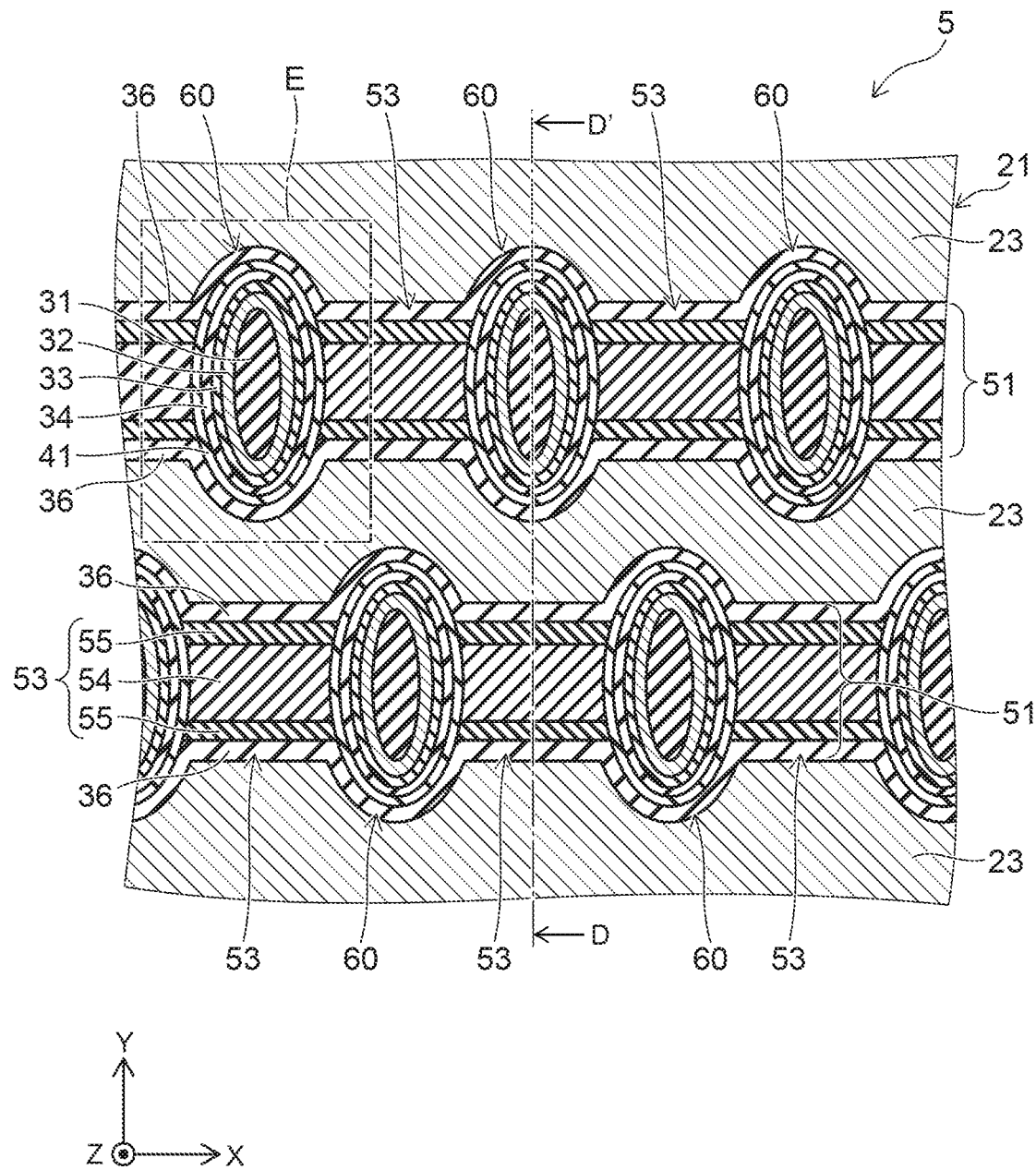
FIG. 8 is a cross-sectional view showing a semiconductor memory device according to a fifth embodiment.

FIG. 8 is a cross-sectional view showing a semiconductor memory device according to the embodiment.

Figure 9:
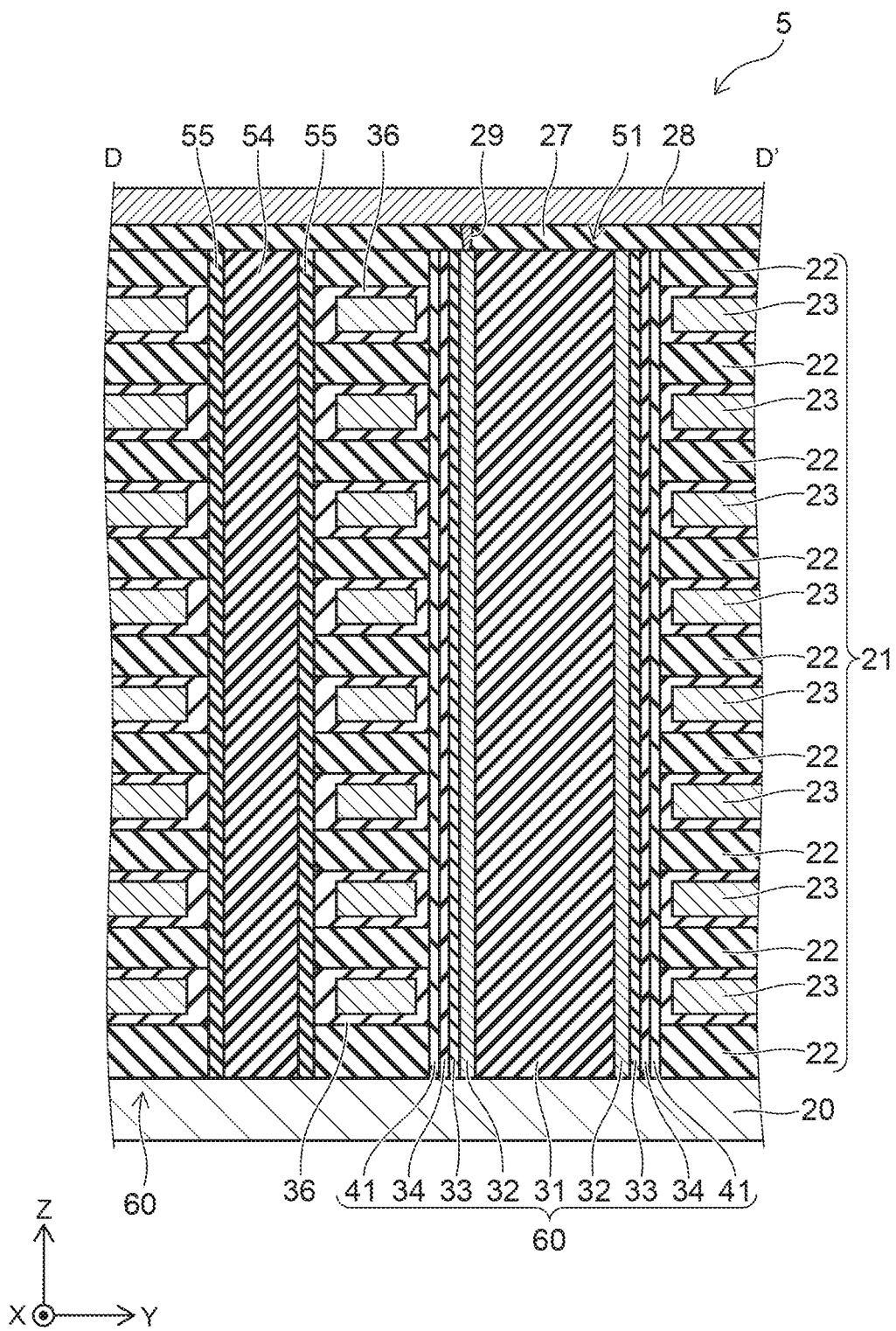
FIG. 9 is a cross-sectional view along line D-D' shown in FIG. 8.

FIG. 9 is a cross-sectional view along line D-D' shown in FIG. 8.

Figure 10:
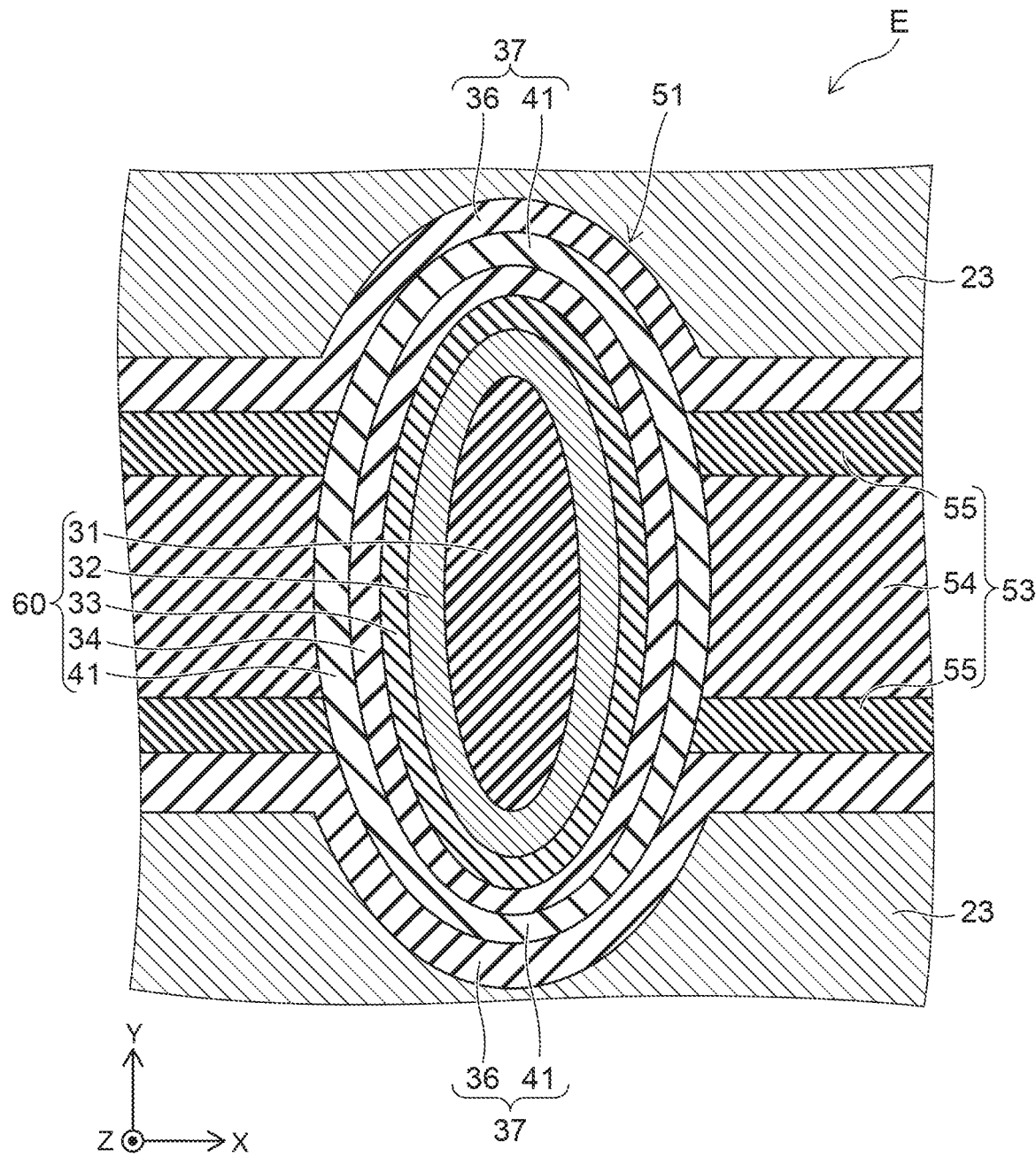
FIG. 10 is a cross-sectional view showing region E of FIG. 8.

FIG. 10 is a cross-sectional view showing region E of FIG. 8.

As shown in FIG. 8 and FIG. 9, the stacked body 21 is provided on the silicon substrate 20 in the semiconductor memory device 5 according to the embodiment. The insulating films 22 and the electrode films 23 are stacked alternately along the Z-direction in the stacked body 21.

Structure bodies 51 are arranged to be separated from each other along the Y-direction inside the stacked body 21. The configurations of the structure bodies 51 are substantially plate configurations spreading along the XZ plane. Accordingly, the insulating films 22 and the electrode films 23 are disposed between the mutually-adjacent structure bodies 51. The stacked body that is made of the insulating films 22 and the electrode films 23 is disposed in each region between the structure bodies 51. In other words, the multiple electrode films 23 that are arranged to be separated from each other along the Z-direction are provided in one stacked body. Also, when viewed from the stacked body, an adjacent stacked body is disposed on the Y-direction side.

In the structure body 51, columnar members 60 and insulating members 53 are arranged alternately along the X-direction in contact with each other. When viewed from the Z-direction, the columnar members 60 are arranged in a staggered configuration. In other words, the positions of the columnar members 60 in the X-direction are shifted between the mutually-adjacent structure bodies 51; and the positions of the columnar members 60 in the X-direction are the same between every other structure body 51. The configurations of the columnar members 60 are, for example, substantially elliptical columns. The central axis of the columnar member 60 extends in the Z-direction; the major axis of the ellipse extends in the Y-direction; and the minor axis of the ellipse extends in the X-direction. The configuration of the insulating member 53 is a substantially quadrilateral column having a central axis extending in the Z-direction. The major diameter, i.e., the length in the Y-direction, of the columnar member 60 is longer than the length in the Y-direction of the insulating member 53.

As shown in FIG. 10, the film configuration of the columnar member 60 is similar to the film configuration of the columnar member 30 of the first embodiment (referring to FIG. 3 and FIG. 4). In other words, in the columnar member 60, a substantially elliptical columnar core member 31 is provided; and the silicon pillar 32, the tunneling insulating film 33, the charge storage film 34, and the fixed charge retaining film 41 are provided in this order from the core member 31 side toward the outer side at the periphery of the core member 31. The compositions of the core member 31, the silicon pillar 32, the tunneling insulating film 33, the charge storage film 34, and the fixed charge retaining film 41 are similar to those of the first embodiment. In other words, the material of the fixed charge retaining film 41 is selected from the materials shown in Table 1. For example, the fixed charge retaining film 41 is formed by depositing a material shown in Table 1 or by diffusing the prescribed element in a main material made of silicon oxide, etc.

In the insulating member 53, an insulating member 54 is provided; and insulating films 55 are provided on the side surfaces of the insulating member 54 facing the two Y-direction sides. The insulating member 54 is made from an insulating material and is made of, for example, silicon oxide. The insulating films 55 are made from an insulating material and are made of, for example, silicon oxide formed by deposition.

The high dielectric constant films 36 are provided on the side surfaces facing the two Y-direction sides of the structure body made of the columnar member 60 and the insulating member 53. The composition and the arrangement position of the high dielectric constant film 36 are similar to those of the first embodiment. The blocking insulating film 37 includes the fixed charge retaining film 41 and the high dielectric constant film 36. The blocking insulating film 37 is provided at least between the charge storage film 34 and the electrode films 23.

In the embodiment as well, a memory cell transistor that has the silicon pillar 32 as a channel and the electrode film 23 as a gate is formed at each crossing portion between the silicon pillars 32 and the electrode films 23. When viewed from the silicon pillar 32, the electrode films 23 are provided on the two Y-direction sides and can be set to mutually-independent potentials; therefore, a memory cell transistor is formed for each electrode film 23. For example, two memory cell transistors that are arranged in the Y-direction are formed in the cross section shown in FIG. 10.

According to the embodiment, the arrangement density of the memory cell transistors can be increased compared to the first embodiment described above.

In the embodiment as well, similarly to the first embodiment described above, the neutral threshold of the memory cell transistor can be adjusted by the fixed charge retaining film 41 retaining the fixed charge.

Otherwise, the configuration and the effects of the embodiment are similar to those of the first embodiment described above.

Sixth Embodiment

A sixth embodiment will now be described.

Figure 11:
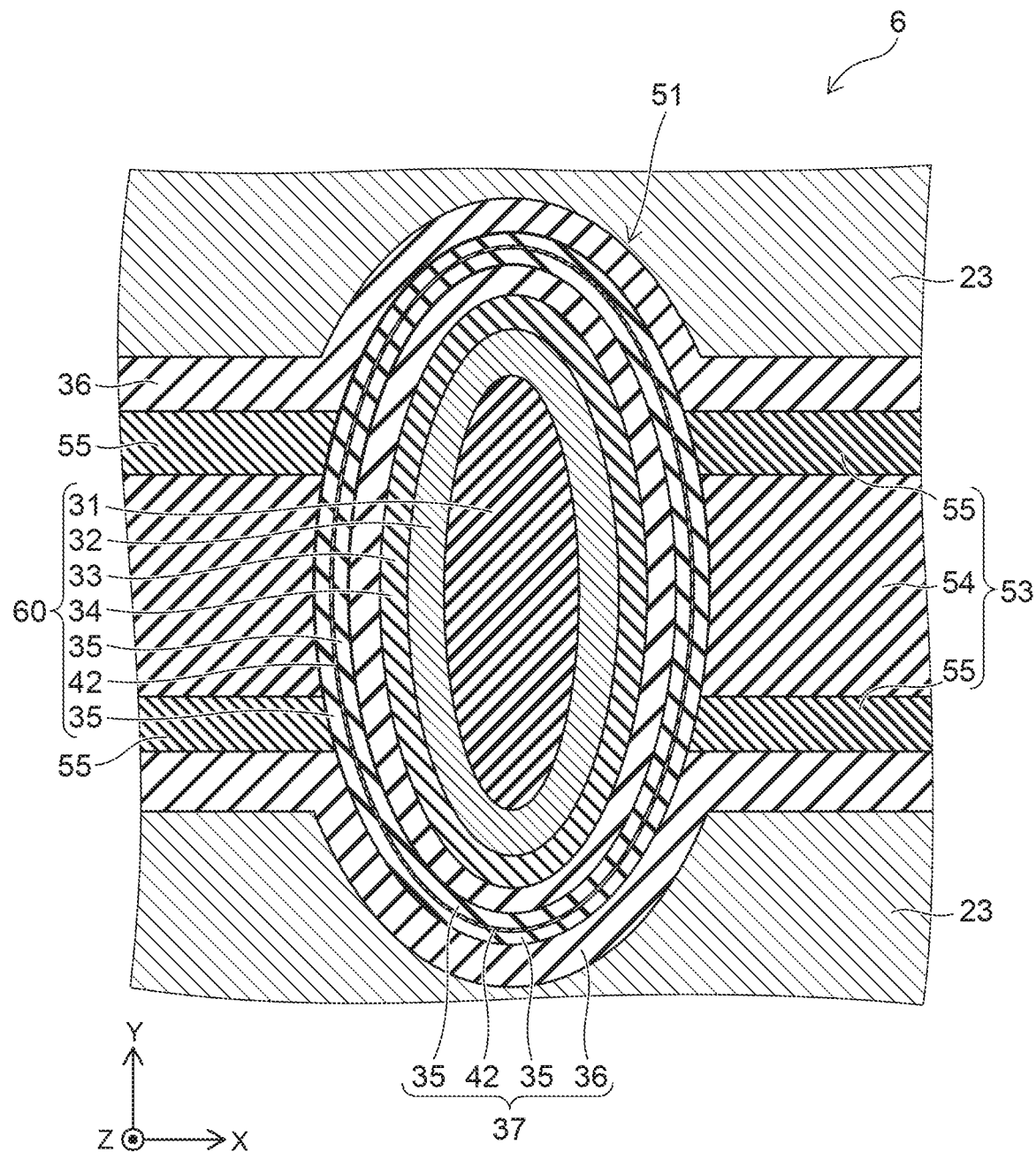
FIG. 11 is a cross-sectional view showing the columnar member of a semiconductor memory device according to a sixth embodiment.

FIG. 11 is a cross-sectional view showing the columnar member of a semiconductor memory device according to the embodiment.

FIG. 11 shows a cross section corresponding to FIG. 10.

The embodiment is an embodiment in which the second embodiment (referring to FIG. 5) and the fifth embodiment (referring to FIG. 8 to FIG. 10) described above are combined.

As shown in FIG. 11, the semiconductor memory device 6 according to the embodiment differs from the semiconductor memory device 5 according to the fifth embodiment described above in that the silicon oxide film 35 and the fixed charge retaining film 42 are provided instead of the fixed charge retaining film 41. The fixed charge retaining film 42 is disposed inside the silicon oxide film 35. The configuration of the fixed charge retaining film 42 is a substantially circular tube having a central axis extending in the Z-direction. The material of the fixed charge retaining film 42 may be selected from the materials shown in Table 1.

Accordingly, the blocking insulating film 37 includes the silicon oxide film 35, the fixed charge retaining film 42, and the high dielectric constant film 36. The columnar member 30 includes the core member 31, the silicon pillar 32, the tunneling insulating film 33, the charge storage film 34, the silicon oxide film 35, and the fixed charge retaining film 42.

In the embodiment, the formation of a leakage path between the charge storage film 34 and the electrode film 23 by the fixed charge retaining film 42 can be suppressed because the fixed charge retaining film 42 is separated from the charge storage film 34 and the high dielectric constant film 36 by the silicon oxide film 35.

Otherwise, the configuration and the effects of the embodiment are similar to those of the second embodiment and the fifth embodiment described above.

Seventh Embodiment

A seventh embodiment will now be described.

Figure 12:
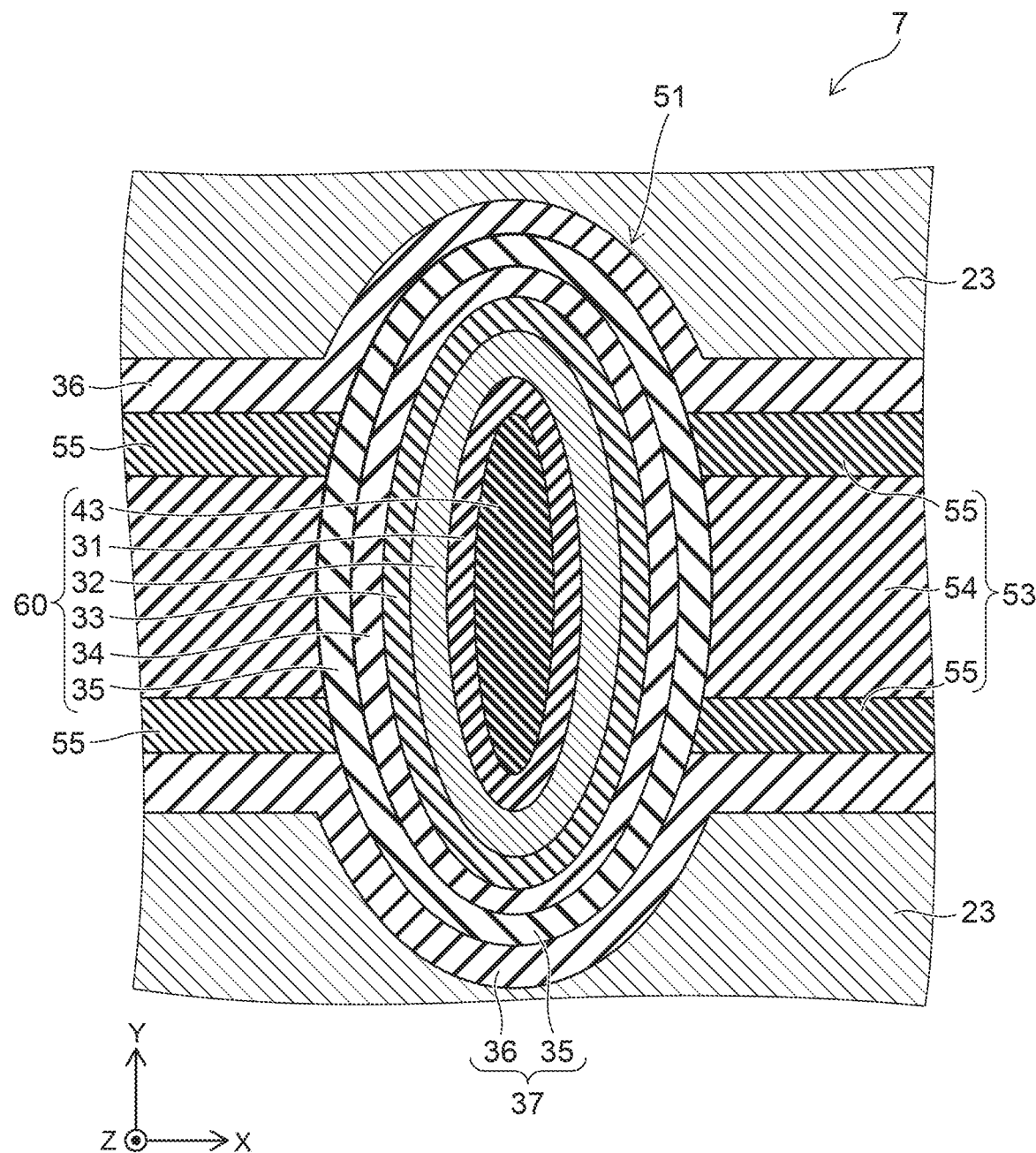
FIG. 12 is a cross-sectional view showing the columnar member of a semiconductor memory device according to a seventh embodiment.

FIG. 12 is a cross-sectional view showing the columnar member of a semiconductor memory device according to the embodiment.

FIG. 12 shows a cross section corresponding to FIG. 10.

The embodiment is an embodiment in which the third embodiment (referring to FIG. 6) and the fifth embodiment (referring to FIG. 8 to FIG. 10) described above are combined.

As shown in FIG. 12, the semiconductor memory device 7 according to the embodiment differs from the semiconductor memory device 5 according to the fifth embodiment described above in that the fixed charge retaining member 43 is provided inside the core member 31; and the silicon oxide film 35 is provided instead of the fixed charge retaining film 41. The configuration of the fixed charge retaining member 43 is, for example, a substantially elliptical column having a central axis extending in the Z-direction. In the embodiment, the configuration of the core member 31 is a substantially elliptical tube having a central axis extending in the Z-direction. The composition and the method for forming the fixed charge retaining member 43 are similar to those of the fixed charge retaining member 43 of the third embodiment.

Otherwise, the configuration and the effects of the embodiment are similar to those of the third embodiment and the fifth embodiment described above.

Eighth Embodiment

An eighth embodiment will now be described.

Figure 13:
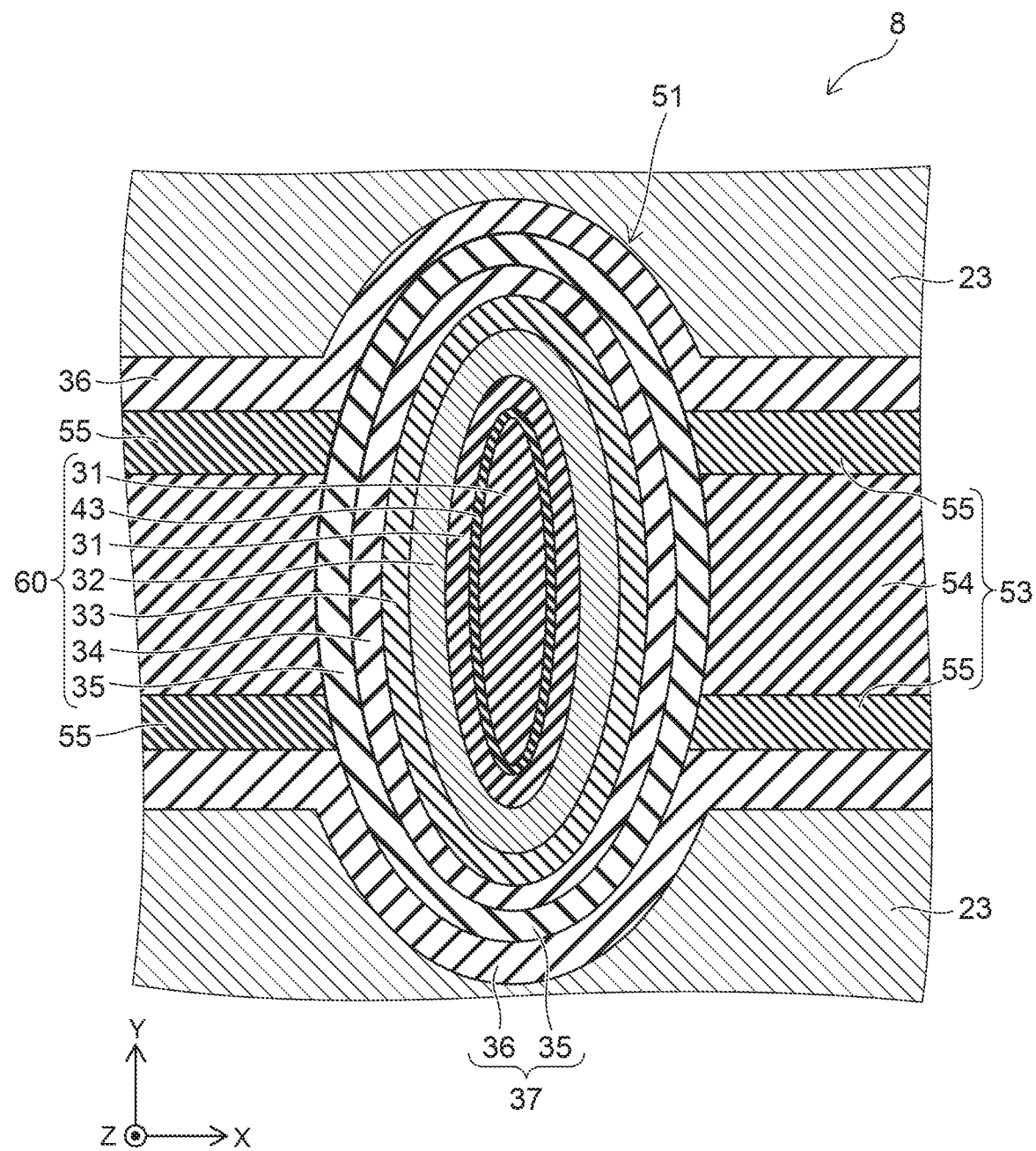
FIG. 13 is a cross-sectional view showing the columnar member of a semiconductor memory device according to an eighth embodiment.

FIG. 13 is a cross-sectional view showing the columnar member of a semiconductor memory device according to the embodiment.

FIG. 13 shows a cross section corresponding to FIG. 10.

The embodiment is an embodiment in which the fourth embodiment (referring to FIG. 7) and the fifth embodiment (referring to FIG. 8 to FIG. 10) described above are combined.

As shown in FIG. 13, the semiconductor memory device 8 according to the embodiment differs from the semiconductor memory device 7 according to the seventh embodiment described above (referring to FIG. 12) in that the configuration of the fixed charge retaining member 43 is a substantially circular tube. In the embodiment, the configuration of the core member 31 is a substantially circular column.

According to the embodiment, by setting the configuration of the fixed charge retaining member 43 to be a substantially circular tube, the distance between the fixed charge retaining member 43 and the silicon pillar 32 can be controlled with high precision; and the neutral threshold of the memory cell transistor can be adjusted using the distance.

Otherwise, the configuration and the effects of the embodiment are similar to those of the seventh embodiment described above.

Ninth Embodiment

A ninth embodiment will now be described.

Figure 14:
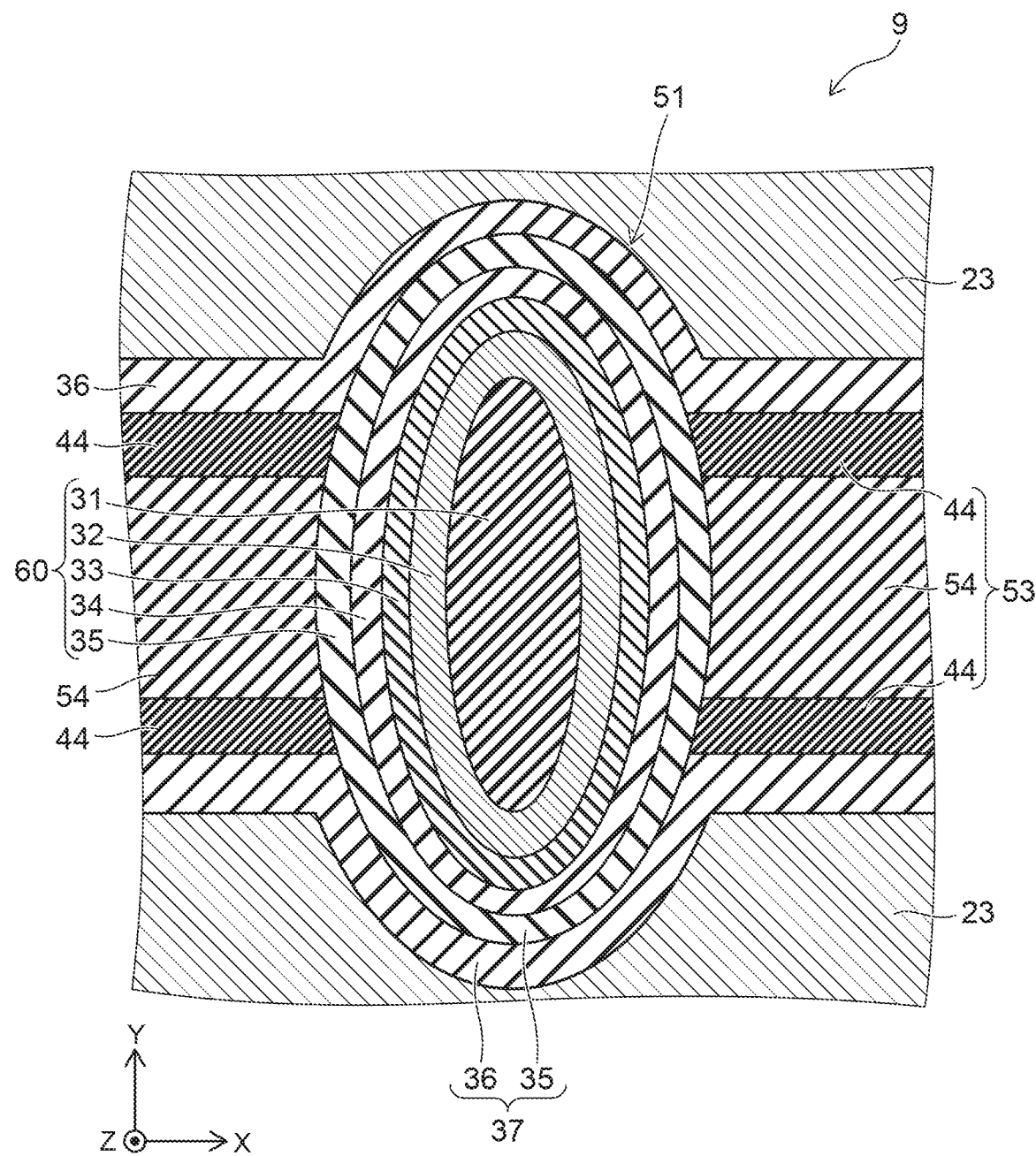
FIG. 14 is a cross-sectional view showing the columnar member of a semiconductor memory device according to a ninth embodiment.

FIG. 14 is a cross-sectional view showing the columnar member of a semiconductor memory device according to the embodiment.

FIG. 14 shows a cross section corresponding to FIG. 10.

As shown in FIG. 14, the semiconductor memory device 9 according to the embodiment differs from the semiconductor memory device 8 according to the eighth embodiment described above (referring to FIG. 13) in that the fixed charge retaining member 43 is not provided inside the core member 31; and a fixed charge retaining film 44 is provided instead of the insulating films 55.

In other words, in the embodiment, the core member 31, the silicon pillar 32, the tunneling insulating film 33, the charge storage film 34, and the silicon oxide film 35 are stacked in this order from the center toward the outer side in the columnar member 60. The blocking insulating film 37 includes the silicon oxide film 35 and the high dielectric constant film 36. In the insulating member 53, the insulating member 54 that is made of silicon oxide is provided; and the fixed charge retaining films 44 are provided on the side surfaces of the insulating member 54 facing the two Y-direction sides.

The material of the fixed charge retaining film 44 is as shown in Table 1. In other words, the fixed charge retaining film 44 includes at least one type of material selected from the group consisting of carbon-containing silicon oxide, silicon nitride, hafnium oxide, silicon oxynitride, and aluminum oxide. The fixed charge retaining film 44 may be formed as a single body of a material shown in Table 1 or may be a material shown in Table 1 diffused in a main material made of, for example, silicon oxide.

In the embodiment as well, because the fixed charge retaining film 44 is interposed between the silicon pillar 32 which is the channel and the electrode film 23 which is the gate, the neutral threshold of the memory cell transistor can be adjusted by the polarity and the density of the fixed charge retained by the fixed charge retaining film 44.

Otherwise, the configuration and the effects of the embodiment are similar to those of the eighth embodiment described above.

Tenth Embodiment

A tenth embodiment will now be described.

Figure 15:
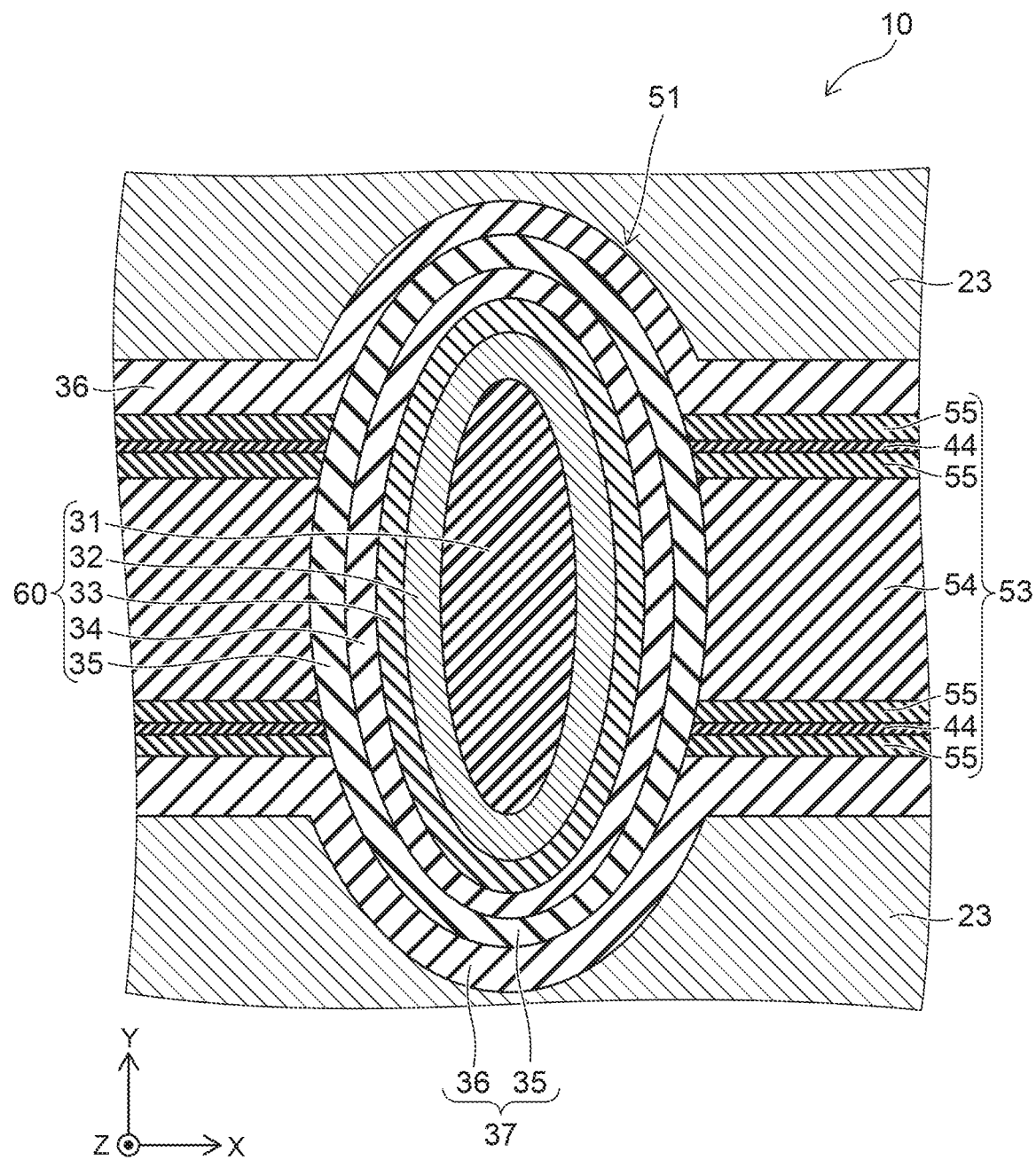
FIG. 15 is a cross-sectional view showing the columnar member of a semiconductor memory device according to a tenth embodiment.

FIG. 15 is a cross-sectional view showing the columnar member of a semiconductor memory device according to the embodiment.

FIG. 15 shows a cross section corresponding to FIG. 10.

As shown in FIG. 15, the semiconductor memory device 10 according to the embodiment differs from the semiconductor memory device 9 according to the ninth embodiment described above (referring to FIG. 14) in that the insulating films 55 are provided in the insulating member 53; and one fixed charge retaining film 44 is provided inside each of the insulating films 55.

The fixed charge retaining film 44 spreads along the XZ plane; and the insulating films 55 are disposed on the two Y-direction sides of the fixed charge retaining film 44. Accordingly, each of the insulating members 53 includes the insulating member 54 made of silicon oxide, the insulating films 55 made of silicon oxide and provided on the two Y-direction sides of the insulating member 54, and one fixed charge retaining film 44 provided inside each of the insulating films 55. The material of the fixed charge retaining film 44 is as described in the ninth embodiment.

In the embodiment as well, the neutral threshold of the memory cell transistor can be adjusted similarly to the ninth embodiment.

Otherwise, the configuration and the effects of the embodiment are similar to those of the ninth embodiment.

It is unnecessary for the fixed charge retaining film 44 always to be a continuous film; and the fixed charge retaining film 44 may be provided to be discontinuous inside the insulating film 55.

Eleventh Embodiment

An eleventh embodiment will now be described.

Figure 16:
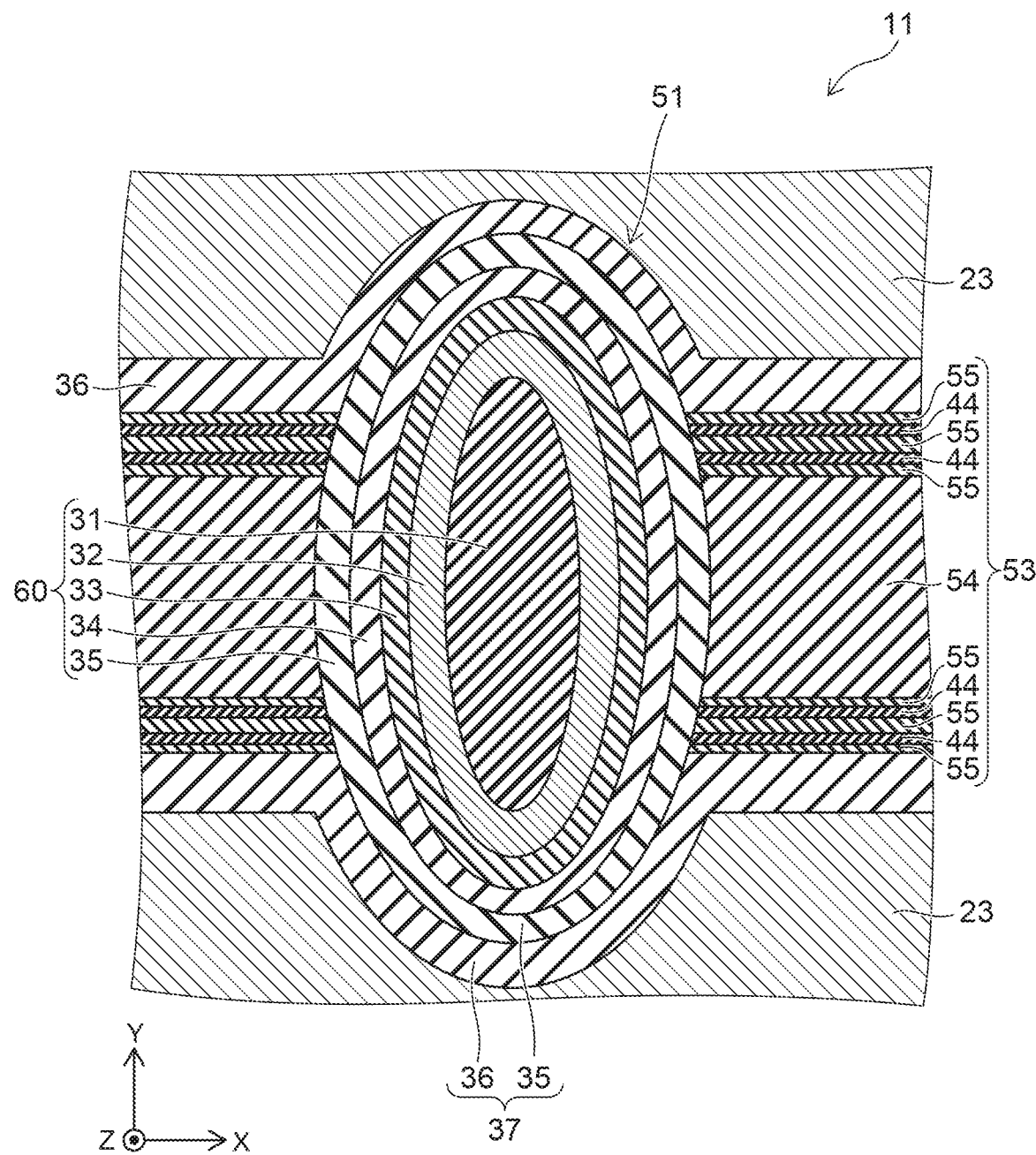
FIG. 16 is a cross-sectional view showing the columnar member of a semiconductor memory device according to an eleventh embodiment.

FIG. 16 is a cross-sectional view showing the columnar member of a semiconductor memory device according to the embodiment.

FIG. 16 shows a cross section corresponding to FIG. 10.

As shown in FIG. 16, the semiconductor memory device 11 according to the embodiment differs from the semiconductor memory device 10 according to the tenth embodiment described above (referring to FIG. 15) in that two of the fixed charge retaining films 44 are provided inside each of the insulating films 55.

According to the embodiment, according to the material of the fixed charge retaining film 44, there are cases where the formation is easy because each of the fixed charge retaining films 44 can be formed to be thin.

Otherwise, the configuration and the effects of the embodiment are similar to those of the tenth embodiment.

Three or more fixed charge retaining films 44 may be provided inside each of the insulating films 55. Each of the fixed charge retaining films 44 may be provided to be discontinuous. Fixed charge retaining particles that are made of a material shown in Table 1 may be dispersed in a dot configuration inside each of the insulating films 55.

Twelfth Embodiment

A twelfth embodiment will now be described.

Figure 17:
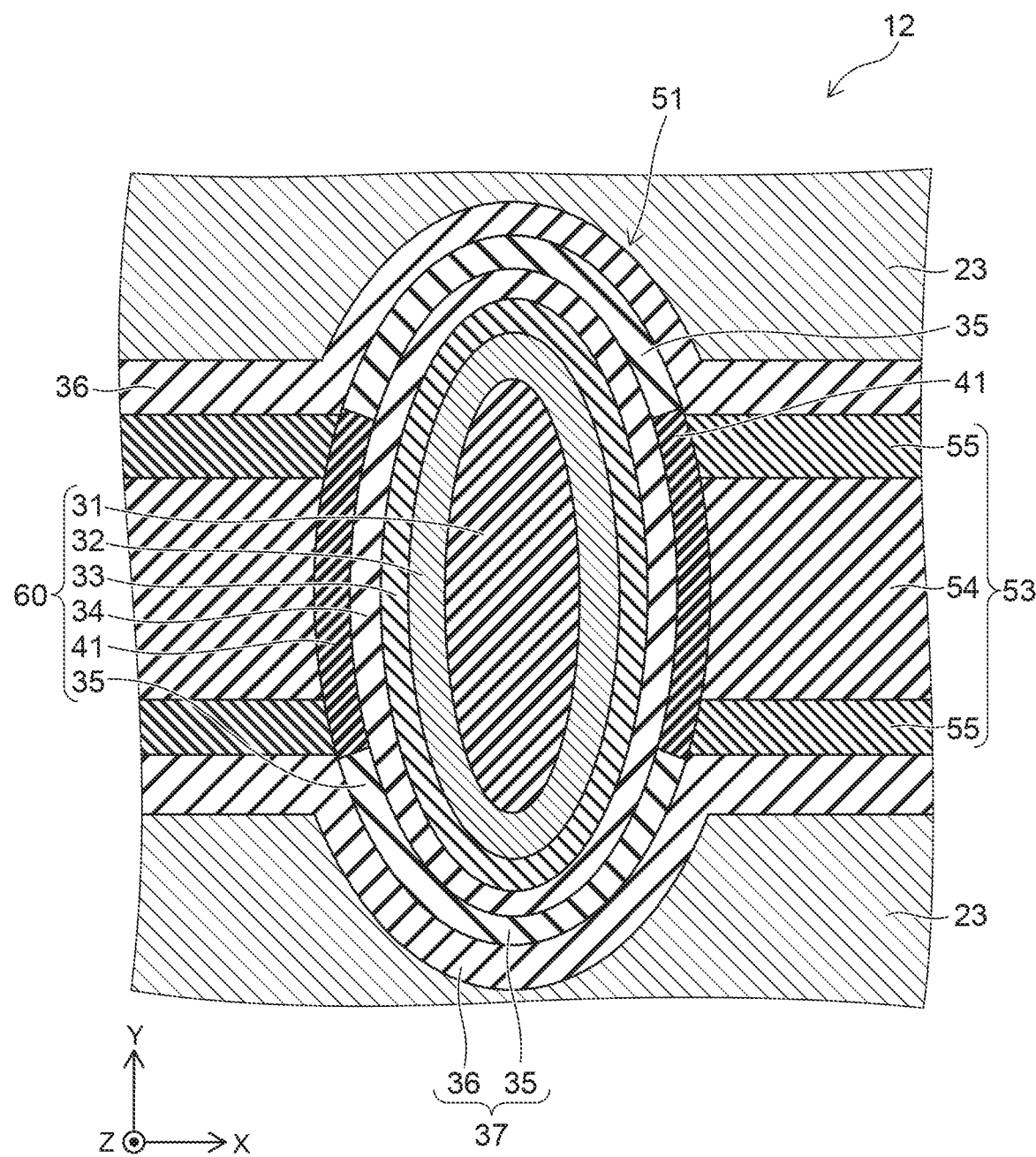
FIG. 17 is a cross-sectional view showing the columnar member of a semiconductor memory device according to a twelfth embodiment.

FIG. 17 is a cross-sectional view showing the columnar member of a semiconductor memory device according to the embodiment.

FIG. 17 shows a cross section corresponding to FIG. 10.

As shown in FIG. 17, the semiconductor memory device 12 according to the embodiment differs from the semiconductor memory device 5 according to the fifth embodiment described above (referring to FIG. 8 to FIG. 10) in that a portion of the fixed charge retaining film 41 is replaced with the silicon oxide film 35. Specifically, the fixed charge retaining film 41 is provided in the portion of the outermost layer of the columnar member 60 contacting the insulating member 53; and the silicon oxide film 35 is provided in the portion of the outermost layer of the columnar member 60 contacting the high dielectric constant film 36. The fixed charge retaining film 41 and the silicon oxide film 35 both contact the charge storage film 34.

According to the embodiment, because the fixed charge retaining film 41 retains the fixed charge, the neutral threshold of the memory cell transistor can be adjusted; and because the silicon oxide film 35 is interposed between the charge storage film 34 and the electrode film 23, the characteristics of the blocking insulating film 37 at this portion can be increased; and the leakage current between the charge storage film 34 and the electrode film 23 can be suppressed more reliably.

Otherwise, the configuration and the effects of the embodiment are similar to those of the fifth embodiment described above.

Thirteenth Embodiment

A thirteenth embodiment will now be described.

Figure 18:
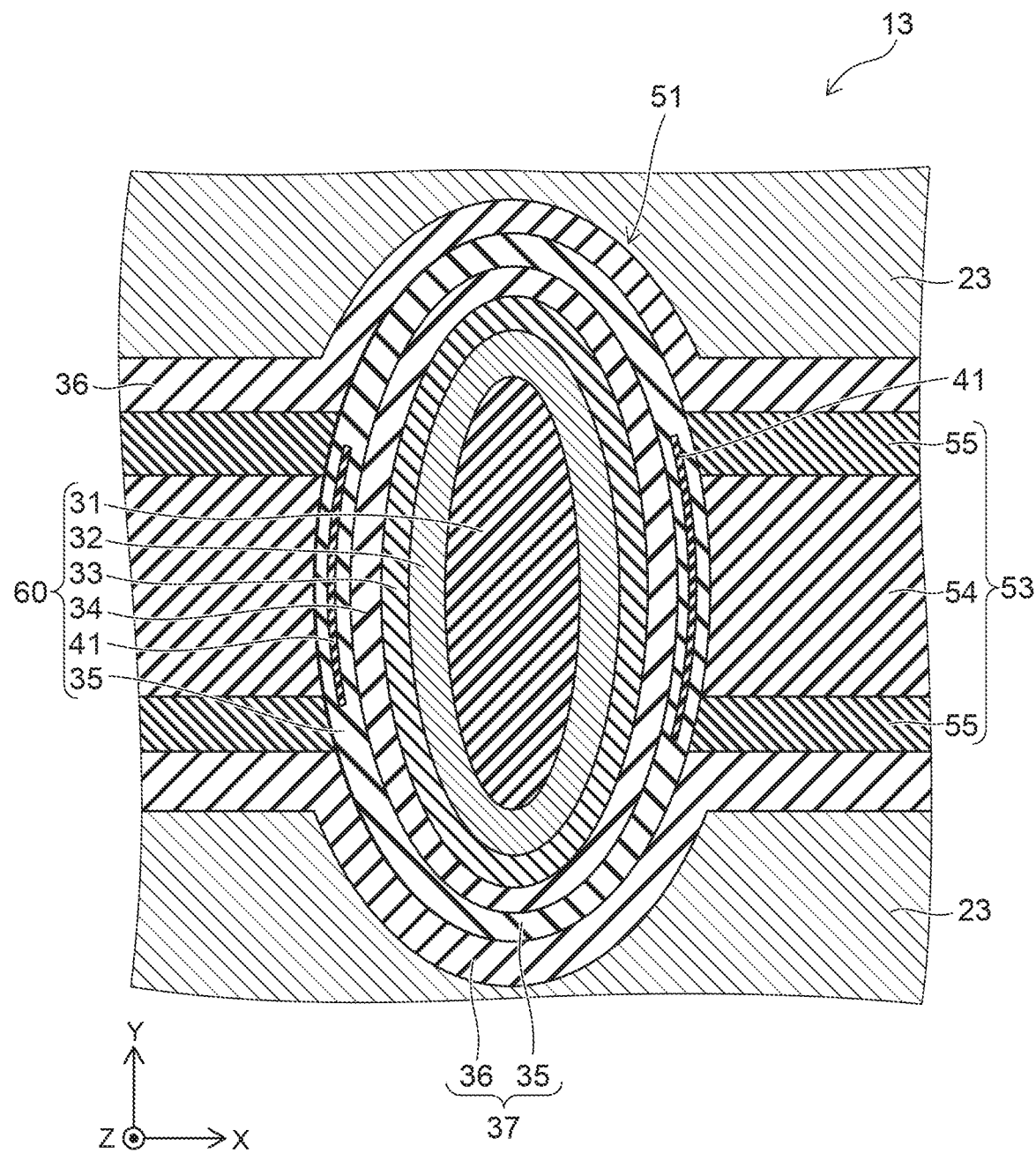
FIG. 18 is a cross-sectional view showing the columnar member of a semiconductor memory device according to a thirteenth embodiment.

FIG. 18 is a cross-sectional view showing the columnar member of a semiconductor memory device according to the embodiment.

FIG. 18 shows a cross section corresponding to FIG. 10.

As shown in FIG. 18, the semiconductor memory device 13 according to the embodiment differs from the semiconductor memory device 12 according to the twelfth embodiment described above (referring to FIG. 17) in that the silicon oxide film 35 is provided in the entire outer perimeter surface of the columnar member 60; and the fixed charge retaining film 41 is provided inside the silicon oxide film 35 only at the vicinity of the insulating member 53. In other words, the fixed charge retaining film 41 contacts only the silicon oxide film 35 and does not contact the charge storage film 34 and the insulating member 53.

According to the embodiment, because the fixed charge retaining film 41 is separated from the charge storage film 34, the generation of the leakage current via the fixed charge retaining film 41 can be suppressed more reliably.

Otherwise, the configuration and the effects of the embodiment are similar to those of the twelfth embodiment described above.

Fourteenth Embodiment

A fourteenth embodiment will now be described.

Figure 19:
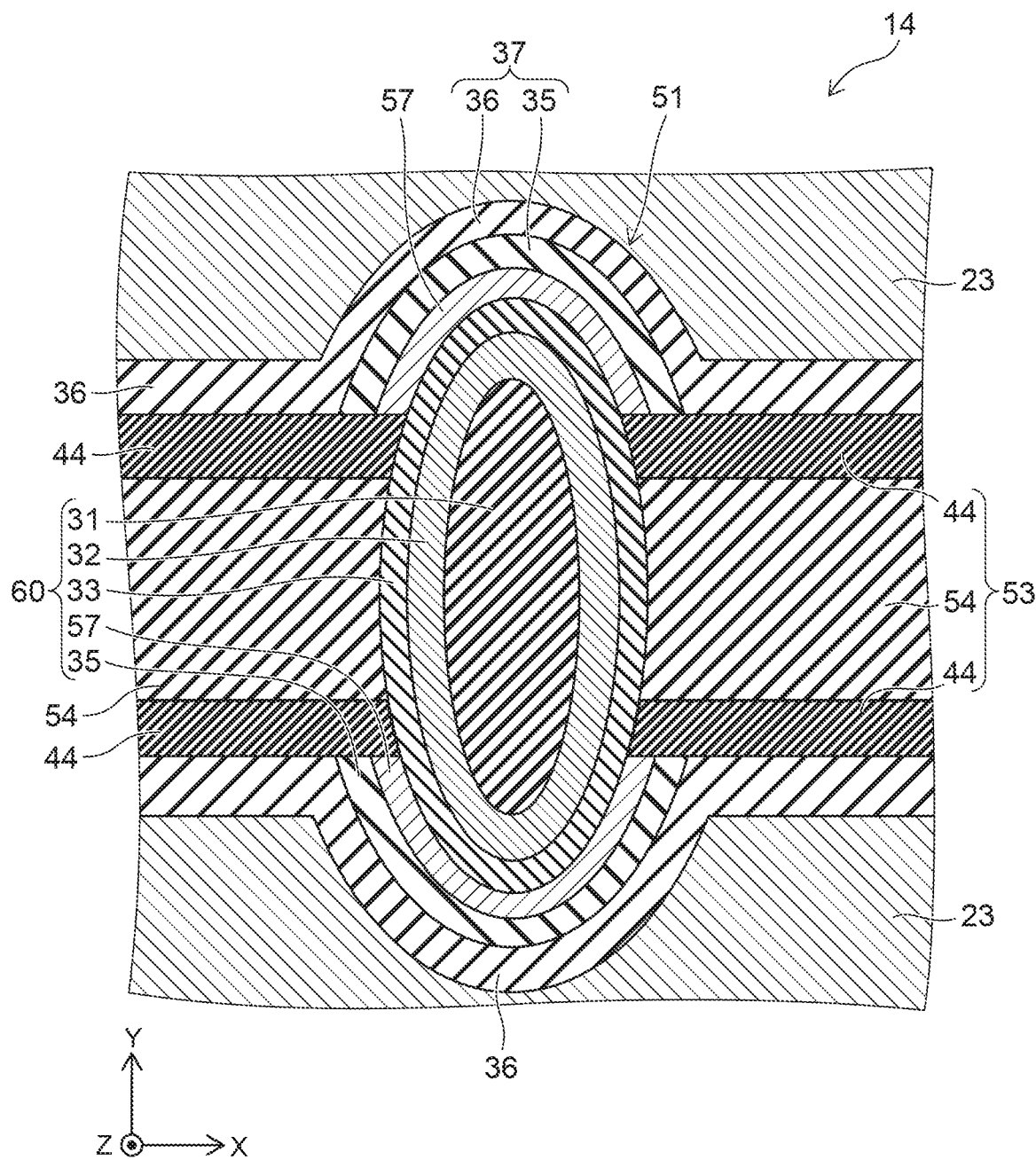
FIG. 19 is a cross-sectional view showing the columnar member of a semiconductor memory device according to a fourteenth embodiment.

FIG. 19 is a cross-sectional view showing the columnar member of a semiconductor memory device according to the embodiment.

FIG. 19 shows a cross section corresponding to FIG. 10.

As shown in FIG. 19, the semiconductor memory device 14 according to the embodiment differs from the semiconductor memory device 9 according to the ninth embodiment described above (referring to FIG. 14) in that a conductive floating electrode 57 is provided instead of the insulative charge storage film 34. For example, the floating electrode 57 is made from a conductive material such as polysilicon, etc., and functions as a charge storage member.

In each of the columnar members 60, the floating electrode 57 and the silicon oxide film 35 are divided into two along the Y-direction by the insulating member 53. The insulating member 53 contacts the tunneling insulating film 33. The floating electrode 57 is divided along the Z-direction every electrode film 23. Thereby, the floating electrode 57 is provided for each memory cell transistor and is in an electrically floating state because the periphery of the floating electrode 57 is surrounded with an insulating material.

According to the embodiment, because the conductive floating electrode 57 is used as the charge storage member, more charge can be stored; and the change amount of the threshold of the memory cell transistor is large. Also, the neutral threshold of the memory cell transistor can be adjusted because the fixed charge retaining film 44 is provided in the insulating member 53.

Otherwise, the configuration and the effects of the embodiment are similar to those of the ninth embodiment described above.

Fifteenth Embodiment

A fifteenth embodiment will now be described.

Figure 20:
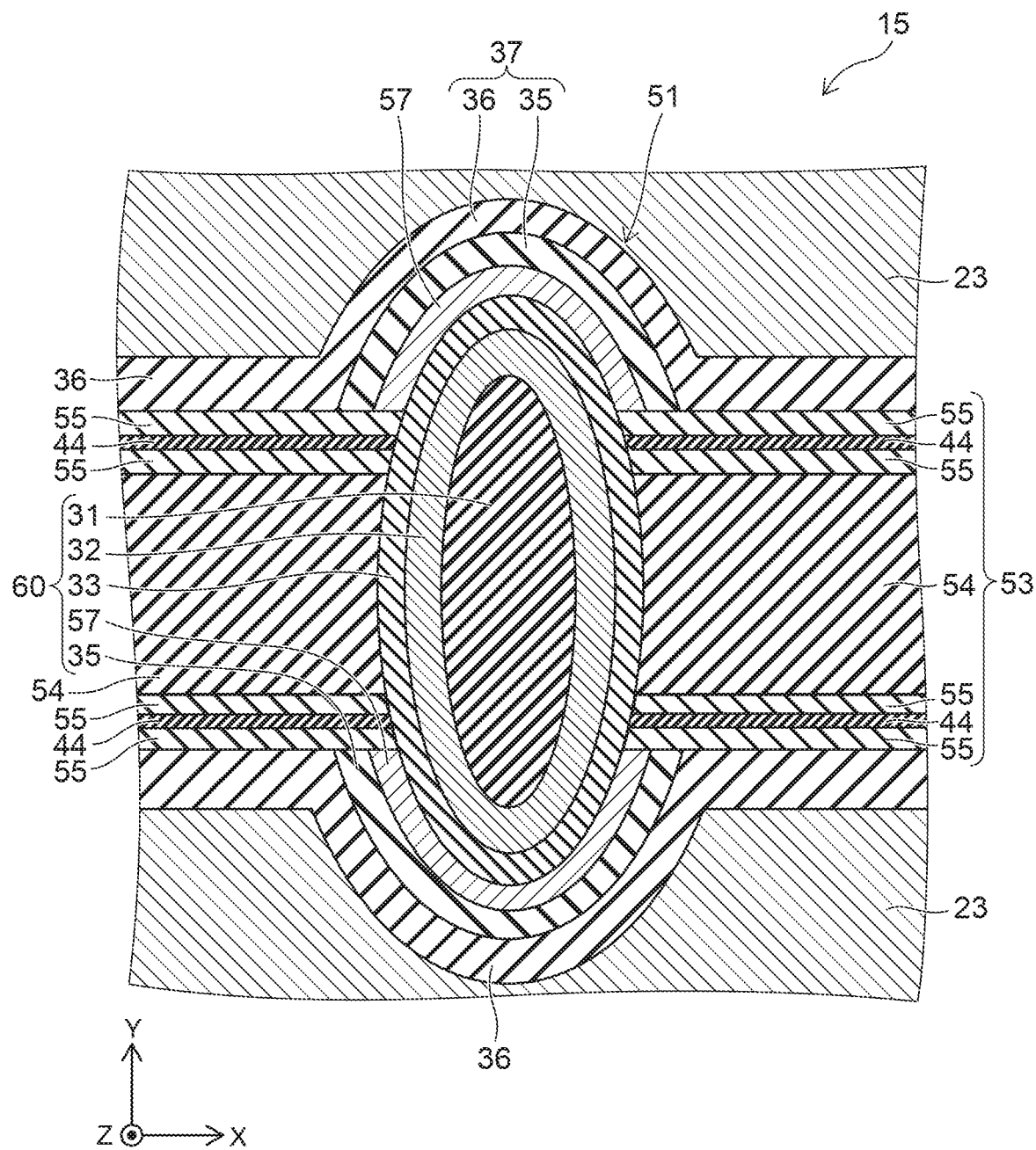
FIG. 20 is a cross-sectional view showing the columnar member of a semiconductor memory device according to a fifteenth embodiment.

FIG. 20 is a cross-sectional view showing the columnar member of a semiconductor memory device according to the embodiment.

FIG. 20 shows a cross section corresponding to FIG. 10.

The embodiment is an embodiment in which the fourteenth embodiment (referring to FIG. 19) and the tenth embodiment (referring to FIG. 15) described above are combined.

As shown in FIG. 20, the semiconductor memory device 15 according to the embodiment differs from the semiconductor memory device 14 according to the fourteenth embodiment described above (referring to FIG. 19) in that the insulating films 55 are provided in the insulating member 53; and one fixed charge retaining film 44 is provided inside each of the insulating films 55. The position, the configuration, and the material of the fixed charge retaining film 44 are as described in the tenth embodiment.

In the embodiment, because the fixed charge retaining film 44 is separated from the floating electrode 57, the leakage via the fixed charge retaining film 44 can be suppressed more reliably.

Otherwise, the configuration and the effects of the embodiment are similar to those of the fourteenth embodiment and the tenth embodiment.

Sixteenth Embodiment

A sixteenth embodiment will now be described.

Figure 21:
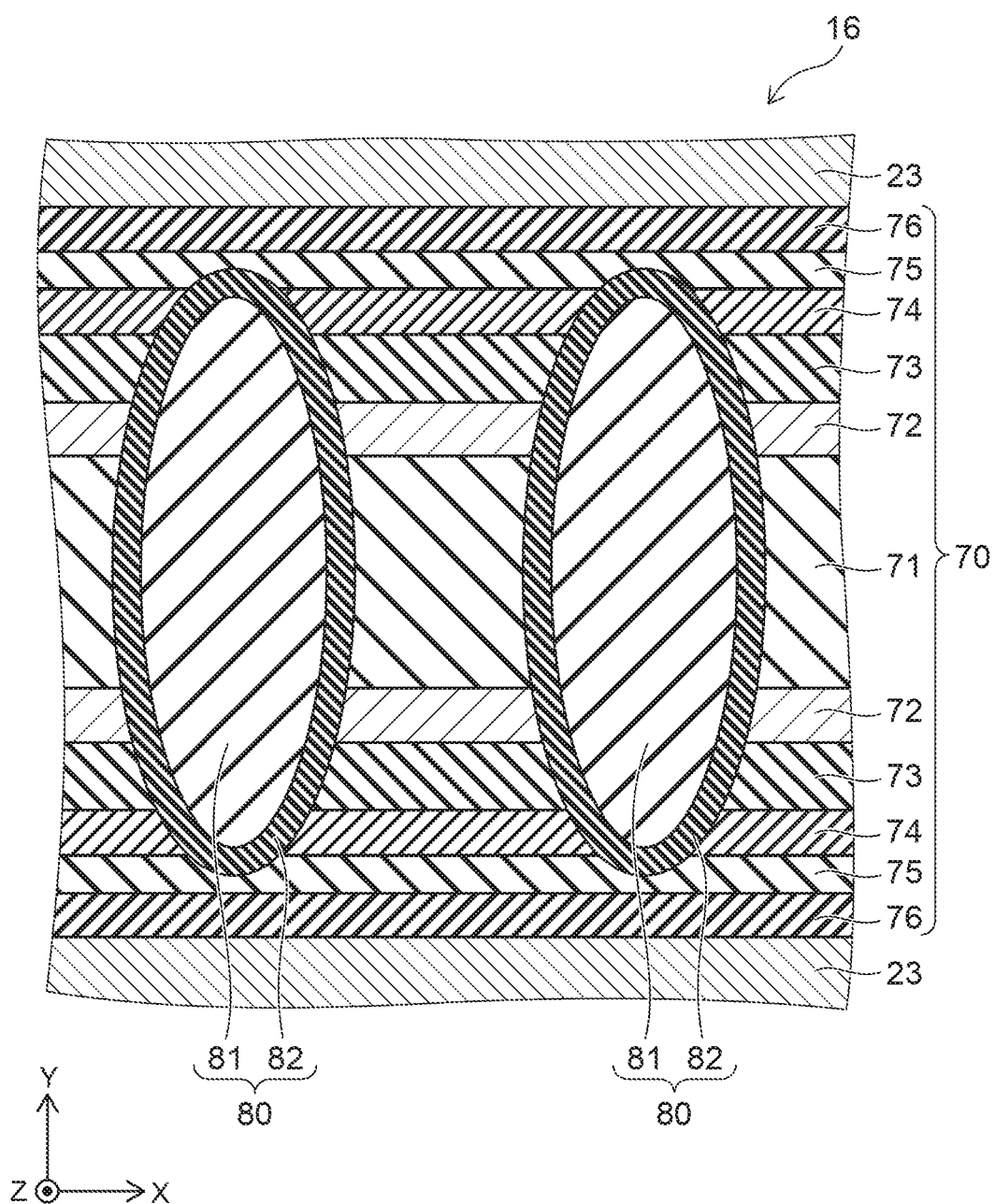
FIG. 21 is a cross-sectional view showing a semiconductor memory device according to a sixteenth embodiment.

FIG. 21 is a cross-sectional view showing a semiconductor memory device according to the embodiment.

In the semiconductor memory device 16 according to the embodiment, similarly to the fifth embodiment described above (referring to FIG. 8 and FIG. 9), the stacked body 21 is provided on the silicon substrate 20; and the insulating films 22 and the electrode films 23 are stacked alternately along the Z-direction in the stacked body 21.

As shown in FIG. 21, multiple structure bodies 70 are provided inside the stacked body 21. The structure bodies 70 are arranged to be separated from each other along the Y-direction. The configuration of each of the structure bodies 70 is a substantially plate configuration spreading along the XZ plane. The structure bodies 70 pierce the stacked body 21 in the Z-direction.

A core member 71 is provided in the Y-direction central portion of the structure body 70. A silicon film 72, a tunneling insulating film 73, a charge storage film 74, a silicon oxide film 75, and a high dielectric constant film 76 are stacked in this order away from the core member 71 on the two Y-direction sides of the core member 71. The compositions of the core member 71, the silicon film 72, the tunneling insulating film 73, the charge storage film 74, the silicon oxide film 75, and the high dielectric constant film 76 respectively are similar to those of the core member 31, the silicon pillar 32, the tunneling insulating film 33, the charge storage film 34, the silicon oxide film 35, and the high dielectric constant film 36 of the fifth embodiment. A blocking insulating film 77 includes the silicon oxide film 75 and the high dielectric constant film 76. The silicon film 72 is connected to the silicon substrate 20 (referring to FIG. 9).

A columnar member 80 is provided inside the structure body 70. The configuration of the columnar member 80 is, for example, an elliptical column; the central axis of the columnar member 80 extends in the Z-direction; the major axis extends in the Y-direction; and the minor axis extends in the X-direction. The columnar member 80 pierces the structure body 70 in the Z-direction. In the columnar member 80, a fixed charge retaining member 81 is provided at a position including the central axis of the columnar member 80. The configuration of the fixed charge retaining member 81 is an elliptical column that is slightly smaller than the columnar member 80. The fixed charge retaining member 81 includes a material shown in Table 1. An insulating film 82 is provided at the periphery of the fixed charge retaining member 81 when viewed from the Z-direction. For example, the insulating film 82 is made from an insulating material such as silicon oxide, etc.; and the configuration of the insulating film 82 is an elliptical tube surrounding the fixed charge retaining member 81.

In the structure body 70, the core member 71, the silicon film 72, the tunneling insulating film 73, and the charge storage film 74 are divided, along the X-direction by the columnar member 80. On the other hand, the silicon oxide film 75 and the high dielectric constant film 76 are not divided by the columnar member 80.

In the semiconductor memory device 16, a memory cell transistor is formed at each crossing portion between the silicon films 72 and the electrode films 23. Because the fixed charge retaining member 81 retains a positive or negative fixed charge, the neutral threshold of the memory cell transistor can be adjusted.

Otherwise, the configuration and the effects of the embodiment are similar to those of the fifth embodiment described above.

Seventeenth Embodiment

A seventeenth embodiment will now be described.

Figure 22:
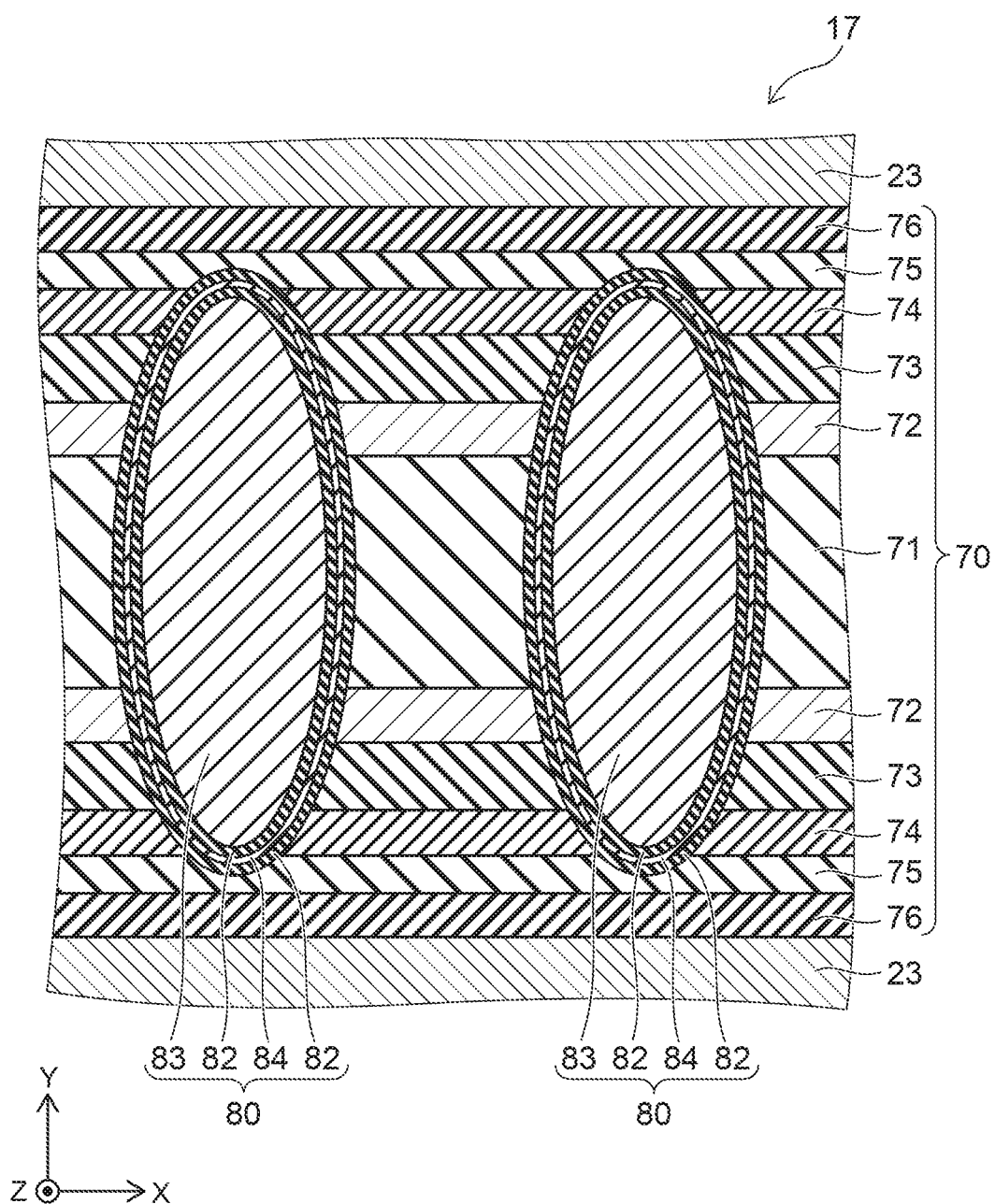
FIG. 22 is a cross-sectional view showing a semiconductor memory device according to a seventeenth embodiment.

FIG. 22 is a cross-sectional view showing a semiconductor memory device according to the embodiment.

As shown in FIG. 22, the semiconductor memory device 17 according to the embodiment differs from the semiconductor memory device 16 according to the sixteenth embodiment described above (referring to FIG. 21) in that a core member 83 is provided instead of the fixed charge retaining member 81; and a fixed charge retaining film 84 is provided inside the insulating film 82. For example, the core member 83 is made of an insulating material such as silicon oxide, etc. The fixed charge retaining film 84 includes a material shown in Table 1. The configuration of the fixed charge retaining film 84 is a substantially elliptical tube having a central axis extending in the Z-direction. The inner surface and the outer surface of the fixed charge retaining film 84 contact the insulating film 82.

According to the embodiment, because the configuration of the fixed charge retaining film 84 is set to be a tubular configuration, the distance between the electrode films 23 can be controlled with high precision; and the neutral threshold of the memory cell transistor can be adjusted using the distance.

Otherwise, the configuration and the effects of the embodiment are similar to those of the sixteenth embodiment described above.

According to the embodiments described above, a three-dimensional semiconductor memory device can be realized in which the adjustment of the neutral threshold is easy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:
   a plurality of electrode films arranged to be separated from each other along a first direction;
   a semiconductor member extending in the first direction;
   a tunneling insulating film provided between the semiconductor member and the electrode films;
   a charge storage member provided between the tunneling insulating film and the electrode films; and
   a blocking insulating film provided between the charge storage member and the electrode films,
   the blocking insulating film including
      a first film contacting the charge storage member and including carbon-containing silicon oxide, and
      a second film provided between the electrode films and the first film, the second film being provided on both sides of one of the electrode films in the first direction, the second film including hafnium oxide or aluminum oxide.

2. The device according to claim 1, wherein the semiconductor member pierces the plurality of electrode films.

3. The device according to claim 1, further comprising a plurality of other electrode films arranged to be separated from each other along the first direction,
   the semiconductor member being disposed between the plurality of electrode films and the plurality of other electrode films.

4. A semiconductor memory device, comprising:
   a plurality of electrode films arranged to be separated from each other along a first direction;
   a semiconductor member extending in the first direction;
   a tunneling insulating film provided between the semiconductor member and the electrode films;
   a charge storage member provided between the tunneling insulating film and the electrode films; and
   a blocking insulating film provided between the charge storage member and the electrode films,
   the blocking insulating film including
      a first film contacting the charge storage member and including silicon oxide,
      a second film provided between the electrode films and the first film, the second film being provided on both sides of one of the electrode films in the first direction, the second film including hafnium oxide or aluminum oxide, and
      a third film provided inside the first film, the third film including at least one type of material selected from the group consisting of carbon-containing silicon oxide, silicon nitride, hafnium oxide, silicon oxynitride, and aluminum oxide.

5. The device according to claim 4, wherein the semiconductor member pierces the plurality of electrode films.

6. The device according to claim 4, further comprising a plurality of other electrode films arranged to be separated from each other along the first direction,
   the semiconductor member being disposed between the plurality of electrode films and the plurality of other electrode films.

7. A semiconductor memory device, comprising:
   a plurality of electrode films arranged to be separated from each other along a first direction;
   an insulating member extending in the first direction and including at least one type of material selected from the group consisting of carbon-containing silicon oxide, silicon nitride, hafnium oxide, and aluminum oxide;
   a semiconductor member provided between the insulating member and the electrode films;
   a tunneling insulating film provided between the semiconductor member and the electrode films;
   a charge storage member provided between the tunneling insulating film and the electrode films; and
   a blocking insulating film provided between the charge storage member and the electrode films.

8. The device according to claim 7, wherein the semiconductor member pierces the plurality of electrode films.

9. The device according to claim 7, further comprising a plurality of other electrode films arranged to be separated from each other along the first direction,
   the semiconductor member being disposed between the plurality of electrode films and the plurality of other electrode films.

10. The device according to claim 1, wherein a first region of the first film contacts a second region of the second film, the first region including carbon-containing silicon oxide, and the second region including hafnium oxide or aluminum oxide.

* * * * *